(12) United States Patent
Shimizu

(10) Patent No.: US 12,557,281 B2
(45) Date of Patent: Feb. 17, 2026

(54) SEMICONDUCTOR MEMORY DEVICE

(71) Applicant: KIOXIA CORPORATION, Tokyo (JP)

(72) Inventor: Kojiro Shimizu, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 638 days.

(21) Appl. No.: 17/883,453

(22) Filed: Aug. 8, 2022

(65) Prior Publication Data
US 2023/0309302 A1 Sep. 28, 2023

(30) Foreign Application Priority Data
Mar. 22, 2022 (JP) .................................. 2022-045742

(51) Int. Cl.
| H10B 43/27 | (2023.01) |
| H10B 41/10 | (2023.01) |
| H10B 41/27 | (2023.01) |
| H10B 41/35 | (2023.01) |
| H10B 43/10 | (2023.01) |
| H10B 43/35 | (2023.01) |

(52) U.S. Cl.
CPC ............. H10B 43/27 (2023.02); H10B 41/27 (2023.02)

(58) Field of Classification Search
CPC ........ H10B 43/27; H10B 41/27; H10B 41/10; H10B 41/35; H10B 43/10; H10B 43/35
See application file for complete search history.

(56) References Cited

U.S. PATENT DOCUMENTS

| 10,748,927 B1 | 8/2020 | Tsutsumi et al. |
| 10,943,917 B2 | 3/2021 | Iwai et al. |
| 2017/0263638 A1* | 9/2017 | Okada .................... H10B 41/27 |
| 2019/0287988 A1* | 9/2019 | Takekida ............. H10D 62/292 |
| 2019/0287995 A1* | 9/2019 | Oike .................. G11C 16/0483 |
| 2020/0251488 A1 | 8/2020 | Iwai et al. |
| 2020/0251489 A1 | 8/2020 | Tsutsumi et al. |
| 2020/0273879 A1* | 8/2020 | Shimizu ................. H10B 43/50 |
| 2020/0303397 A1 | 9/2020 | Cui et al. |
| 2021/0280600 A1 | 9/2021 | Iguchi |

* cited by examiner

*Primary Examiner* — Christine S. Kim
*Assistant Examiner* — Sesha Sairaman Srinivasan
(74) *Attorney, Agent, or Firm* — Kim & Stewart LLP

(57) ABSTRACT

A semiconductor memory device includes first conductive layers stacked in a first direction. A bit line is above the first conductive layers in the first direction. A second conductive layer and a first insulating layer are between the first conductive layers and the bit line. A first pillar extends through the first conductive layers and the second conductive layer. A first via contact connected to an end of the first pillar is on a bit line side. The distance between an upper end of the first insulating layer and an upper surface of the second conductive layer is greater than or equal to the distance between an upper end of the first via contact and the upper surface of the second conductive layer.

18 Claims, 32 Drawing Sheets

SEMICONDUCTOR MEMORY DEVICE

CROSS-REFERENCE TO RELATED APPLICATION(S)

This application is based upon and claims the benefit of priority from Japanese Patent Application No. 2022-045742, filed Mar. 22, 2022, the entire contents of which are incorporated herein by reference.

FIELD

Embodiments described herein relate generally to a semiconductor memory device.

BACKGROUND

A stacked type semiconductor memory device is known in which a gate insulating layer on a memory pillar provides a memory unit capable of storing data. For example, such a memory unit may include an insulating charge storage film made of silicon nitride (SiN) or a conductive charge storage film functioning as a floating gate.

DETAILED DESCRIPTION

Figure 1:
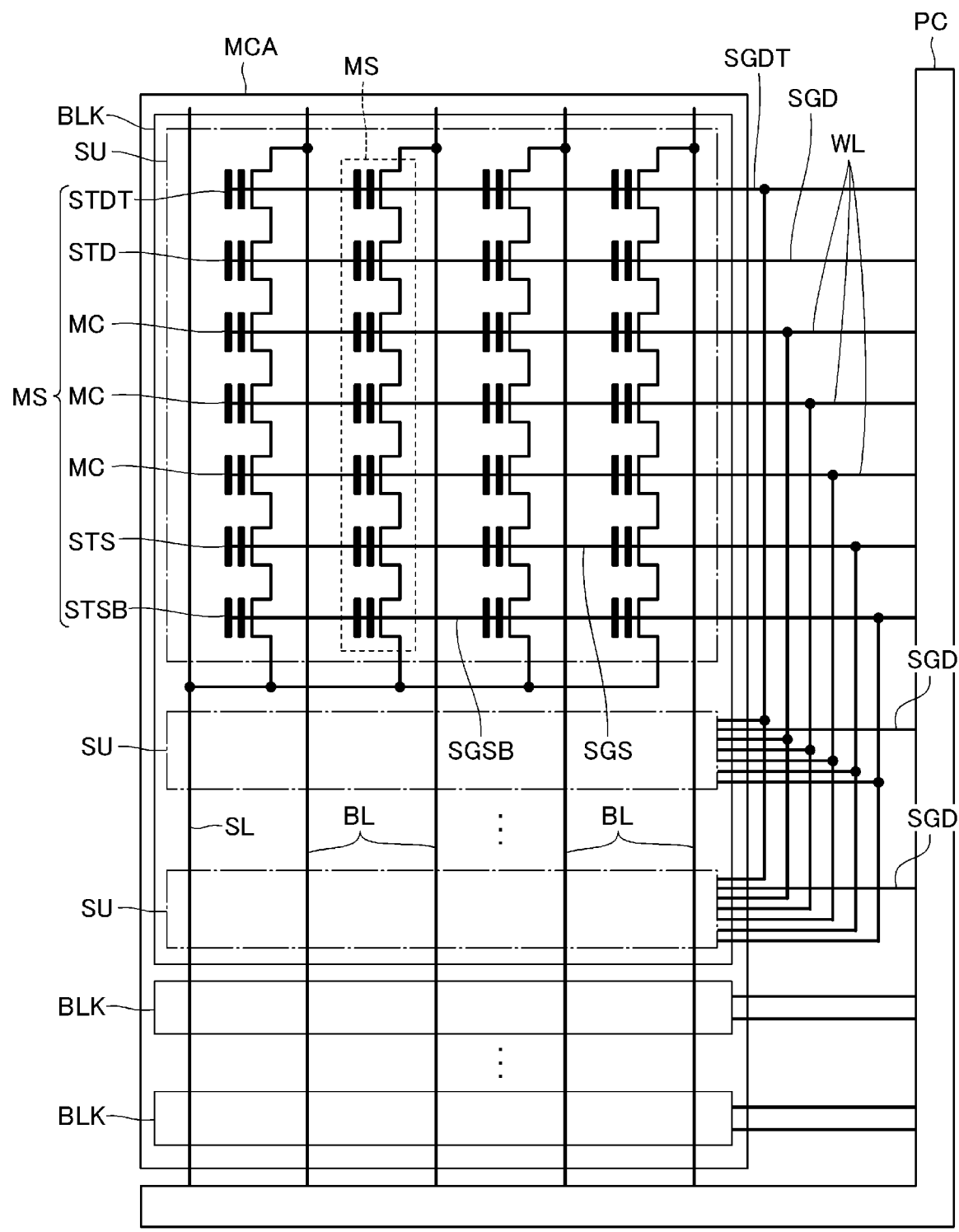
FIG. 1 is a schematic circuit diagram showing a configuration of a semiconductor memory device according to a first embodiment.

In general, according to one embodiment, a semiconductor memory device includes a plurality of first conductive layers adjacent in a first direction. A bit line is on one side of the plurality of first conductive layers and extending in a second direction that intersects the first direction. A second conductive layer is between the bit line and the plurality of first conductive layers. A first insulating layer is between the bit line and the plurality of first conductive layers and adjacent to the second conductive layer in the second direction. A first semiconductor pillar extends in the first direction through the second conductive layer and the plurality of first conductive layers. A first charge storage film is between the first semiconductor pillar and the plurality of first conductive layers. A first via contact electrode is connected to an end portion of the first semiconductor pillar on a bit line side of the first semiconductor pillar. When a position, along the first direction, of an end portion of the first insulating layer on the bit line side is a first position; a position, along the first direction, of an end portion of the first via contact electrode on the bit line side is a second position, and a position, along the first direction, of a surface of the second conductive layer on the bit line side is a third position, a distance between the first position and the third position is greater than or equal to a distance between the second position and the third position.

Hereinafter, semiconductor memory devices according to certain example embodiments will be described with reference to the drawings. The following are merely examples, and are not intended to limit the present disclosure. The drawings are schematic, and some components or the like may be omitted for convenience of description. Furthermore, those portions common to the plurality of embodiments are denoted by the same reference numerals, and descriptions thereof may be omitted when describing subsequent embodiments.

In the present specification, a "semiconductor memory device" may refer to a memory die or to a memory system including a controller die. Thus, for example, a semiconductor memory device may be a memory chip, a memory card, or a solid-state drive (SSD). Additionally, a "semiconductor memory device" may include a configuration incorporating, or an integration with, a host computer, such as a smartphone, a tablet terminal, or a personal computer.

In the present specification, when a first component is said to be "electrically connected" to a second component, the first component may be directly connected to the second component, or the first component may be connected to the second component via another element such as a wiring, a semiconductor member, a transistor, or the like. For example, when three transistors are connected in series, the first transistor can still be considered to be "electrically connected" to the third transistor even if the second transistor is presently in an OFF state.

In the present specification, when a first component is said to be "connected between" a second component and a third component, it may mean that the first component, the second component, and the third component are connected in series, such that the second component is connected to the third component with the first component interposed therebetween.

In the present specification, a direction parallel to an upper surface of a substrate is referred to as an X direction, a direction parallel to the upper surface of the substrate and perpendicular to the X direction is referred to as a Y direction, and a direction orthogonal to the upper surface of the substrate is referred to as a Z direction.

In the present specification, expressions such as "upper" and "lower" are based on reference to the substrate position. For example, a direction of going away from the substrate along the Z direction is referred to as an upper direction and a direction approaching the substrate along the Z direction is referred to as a lower direction. In such a context, a lower surface or a lower end of a certain component refers to a surface or an end portion of the component on a substrate side, and an upper surface or an upper end of a certain component refers to a surface or an end portion of the component on a side away from the substrate. A surface intersecting the X direction or the Y direction may be referred to as a side surface or the like.

Further, in the present specification, references to a "width", a "length", a "thickness", or other dimensions of a component or member in a predetermined direction may be considered to refer to a "width", a "length", a "thickness", or other dimension as measured in a cross section or otherwise by scanning electron microscopy (SEM), transmission electron microscopy (TEM) or the like.

First Embodiment

Configuration

FIG. 1 is a schematic circuit diagram showing a configuration of a semiconductor memory device according to a first embodiment. As shown in FIG. 1, the semiconductor memory device according to the first embodiment includes a memory cell array MCA and a peripheral circuit PC.

The memory cell array MCA includes a plurality of memory blocks BLK. Each of the memory blocks BLK includes a plurality of string units SU. Each of the string units SU includes a plurality of memory strings MS. One end of each of the memory strings MS is connected to the peripheral circuit PC via a bit line BL. The opposite ends of the memory strings MS are connected to the peripheral circuit PC via a common source line SL.

Each of the memory strings MS includes drain-side select transistors STDT and STD, a plurality of memory cells MC (memory transistors), and source-side select transistors STS and STSB. The drain-side select transistors STDT and STD, the plurality of memory cells MC, and the source-side select transistors STS and STSB are connected in series between the bit line BL and the source line SL. Hereinafter, the drain-side select transistors STDT and STD and the source-side select transistors STS and STSB may be simply referred to as select transistors (STDT, STD, STS, and STSB).

Each of the memory cells MC is a field effect transistor. A memory cell MC comprises a part of a semiconductor pillar, a gate insulating film, and a gate electrode. The part of the semiconductor pillar functions as a channel region. The gate insulating film provides a charge storage film. A threshold voltage of the memory cell MC changes according to the amount of charges in the charge storage film. The memory cell MC may store one bit or multiple bits of data. Word lines WL are respectively connected to the gate electrodes of each of the plurality of memory cells MC in a memory string MS. Each of these word lines WL is shared by all the memory strings MS in a memory block BLK.

Each of the select transistors (STDT, STD, STS, and STSB) is a field effect transistor. Each of the select transistors (STDT, STD, STS, and STSB) comprises a part of a semiconductor pillar, a gate insulating film, and a gate electrode. The part of the semiconductor pillar functions as a channel region. Select gate lines (SGDT, SGD, SGS, and SGSB) are connected to the gate electrodes of the select transistors (STDT, STD, STS, and STSB), respectively. One drain-side select gate line SGDT is commonly connected to all the memory strings MS in one memory block BLK. One drain-side select gate line SGD is commonly connected to all the memory strings MS in one string unit SU. One source-side select gate line SGS is commonly connected to all the memory strings MS in one memory block BLK. One source-side select gate line SGSB is commonly connected to all the memory strings MS in one memory block BLK.

The peripheral circuit PC includes, for example: a voltage generation circuit that generates an operation voltage; a voltage transfer circuit that transfers the generated operation voltage to the selected bit line BL, the selected word line WL, the source line SL, the select gate lines (SGDT, SGD, SGS, and SGSB), or the like; a sense amplifier module connected to the bit line BL; and a sequencer that controls these components.

Figure 2:
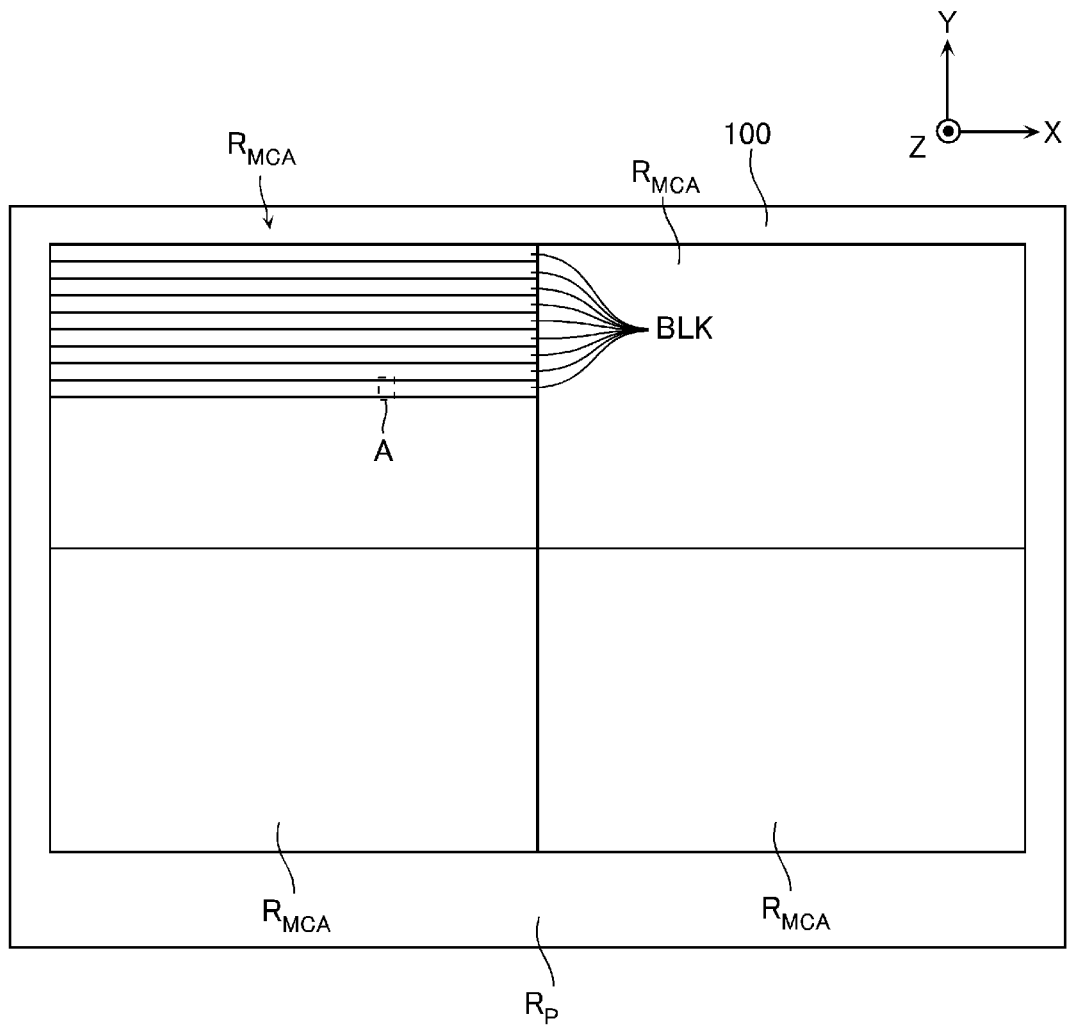
FIG. 2 is a schematic plan view showing a configuration of a part of a semiconductor memory device.
Figure 3:
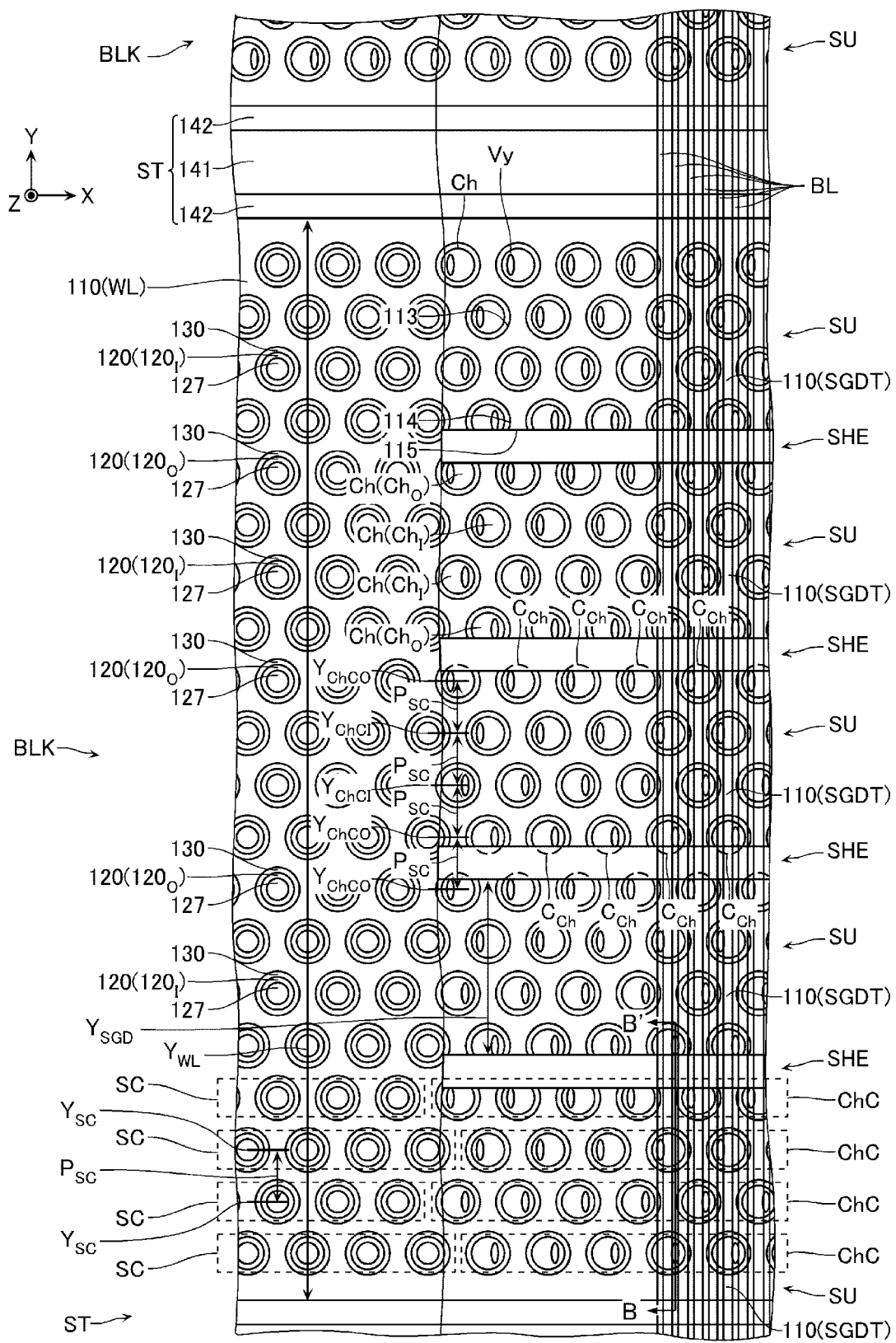
FIG. 3 is a schematic enlarged view of a portion labelled "A" in FIG. 2.
Figure 4:
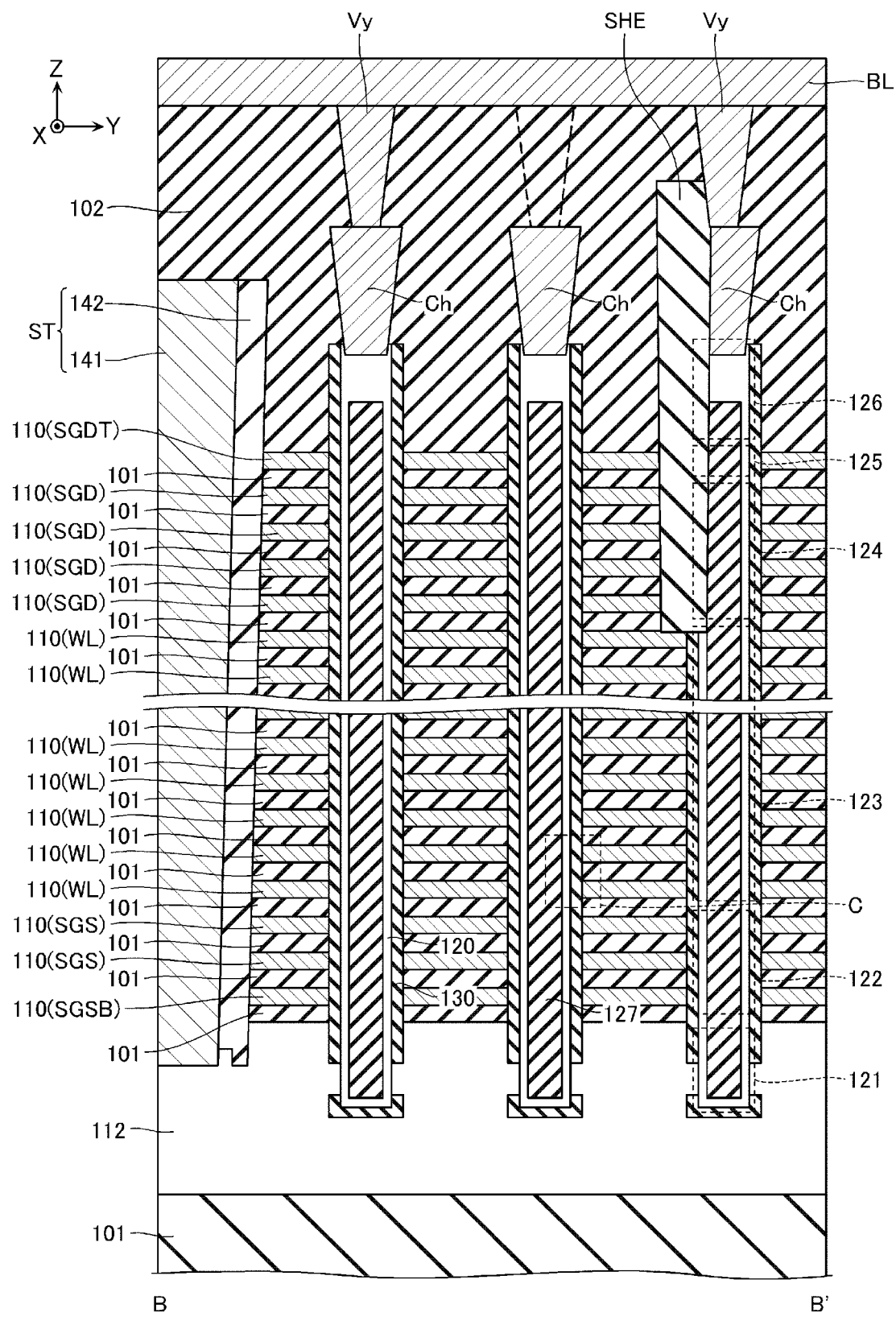
FIG. 4 is a schematic cross-sectional view taken along a line B-B' in FIG. 3.
Figure 5:
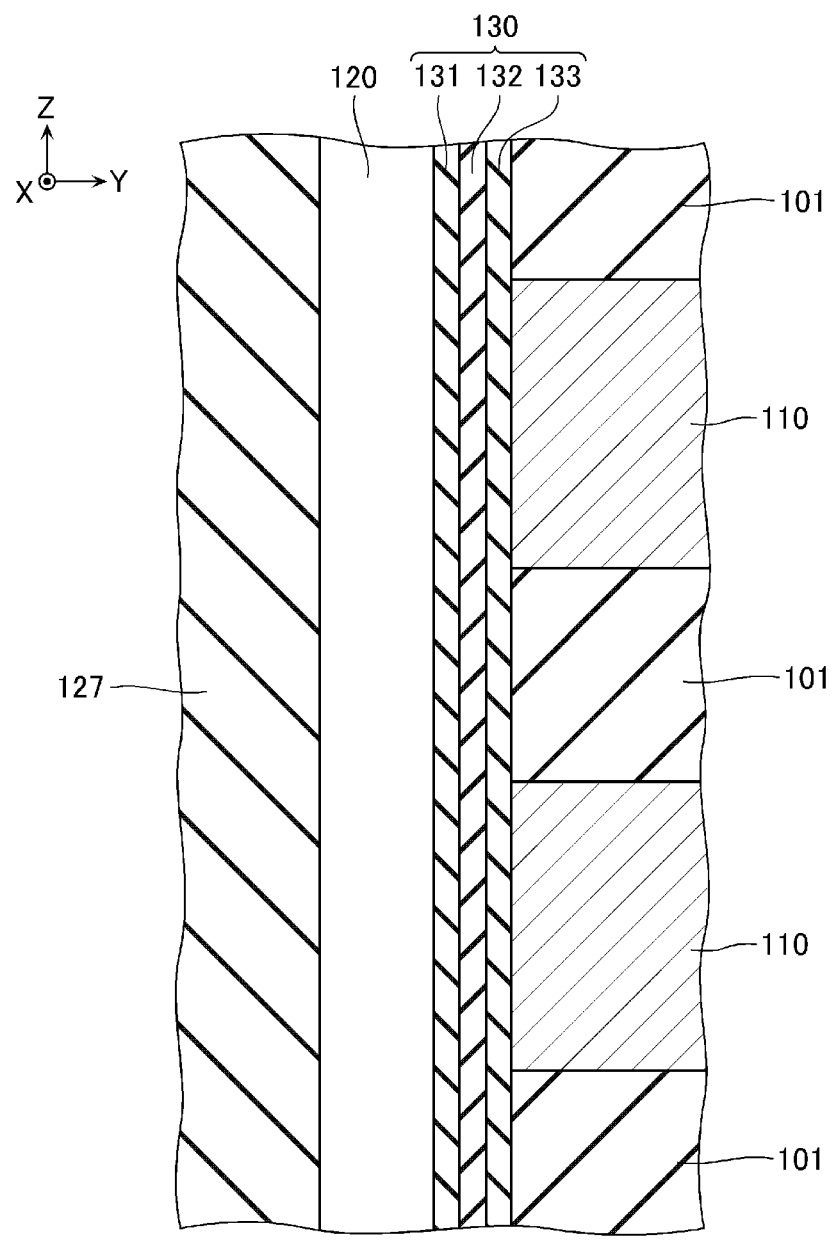
FIG. 5 is a schematic enlarged view of a portion labelled "C" in FIG. 4.
Figure 6:
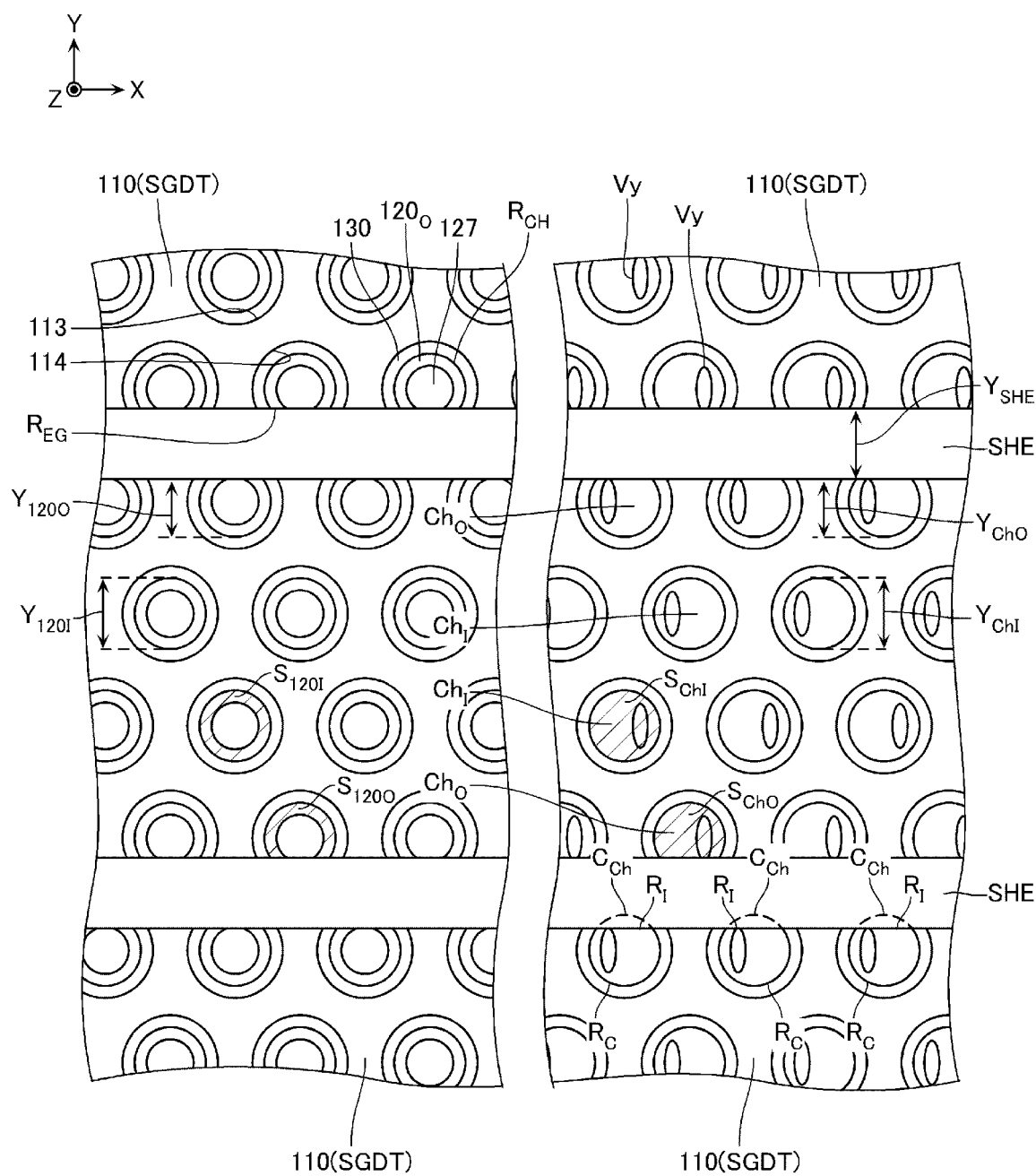
FIG. 6 is a schematic plan view showing a configuration of a part of a semiconductor memory device.
Figure 7:
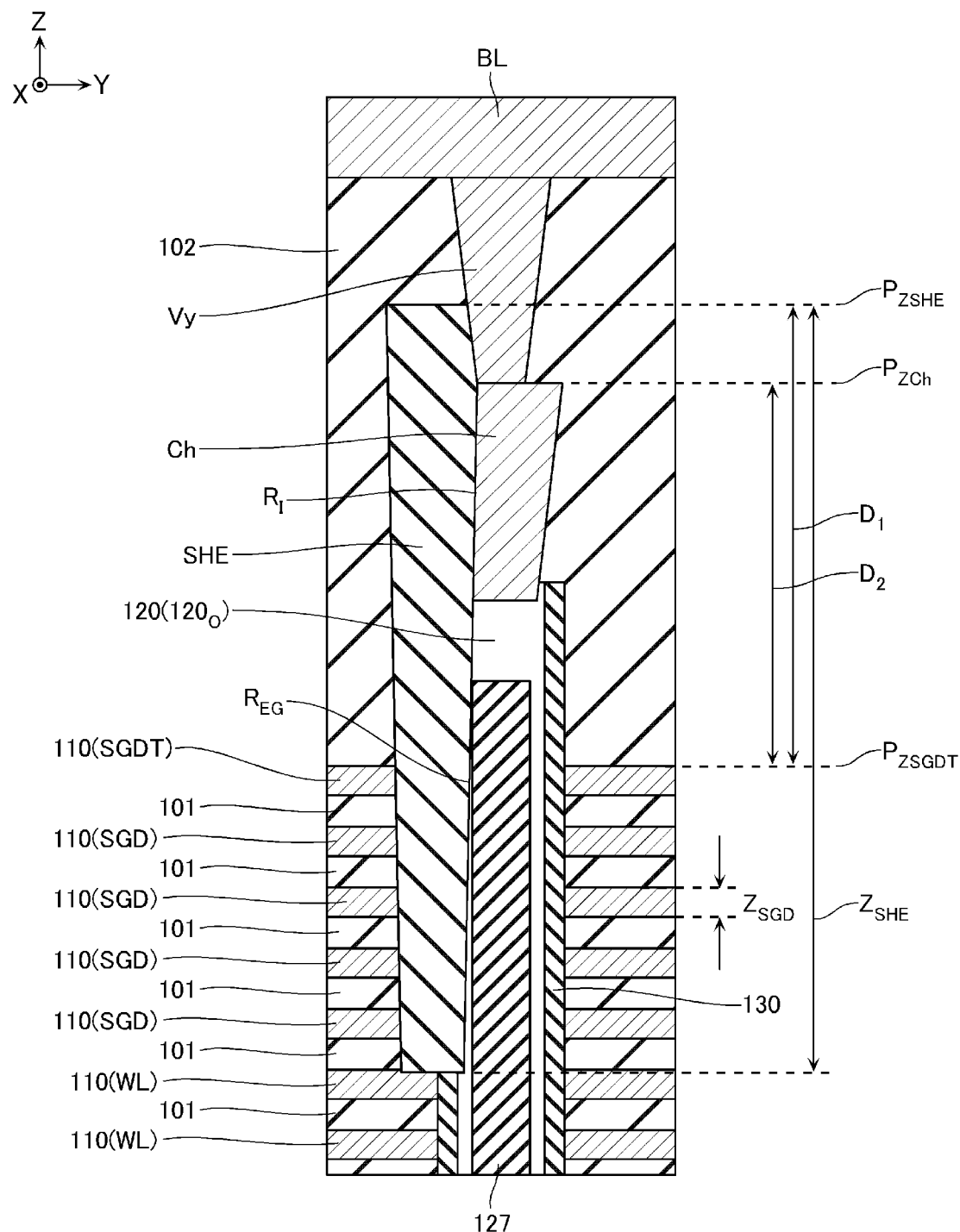
FIG. 7 is a schematic enlarged view showing a configuration of a part of FIG. 4.

Next, a configuration example of a semiconductor memory device according to the first embodiment will be described with reference to FIGS. 2 to 7. FIG. 2 is a schematic plan view showing a configuration of a part of the semiconductor memory device. FIG. 3 is a schematic enlarged view of a portion indicated by A in FIG. 2. A part of FIG. 3 shows an XY cross section at a height position corresponding to a conductive layer 110 (WL) (see, e.g., FIG. 4). A part of FIG. 3 shows a plane with the bit lines BL and an insulating layer 102 (see, e.g., FIG. 4) omitted. A part of FIG. 3 illustrates a portion of the bit lines BL. FIG. 4 is a schematic cross-sectional view of a structure shown in FIG. 3 taken along a line B-B' and viewed along a direction of an arrow. FIG. 5 is a schematic enlarged view of a portion indicated by C in FIG. 4. FIG. 5 shows a YZ cross section, but a structure similar to that in FIG. 5 is also observed when a cross section (for example, an XZ cross section) other than the YZ cross section along a central axis of a semiconductor pillar 120 is observed. FIG. 6 is a schematic plan view showing a configuration of a part of the semiconductor memory device. A part of FIG. 6 shows an XY cross section at a height position corresponding to a conductive layer 110 (SGDT) to be described later. Further, a part of FIG. 6 shows a plane with the bit lines BL and the insulating layer 102 omitted. FIG. 7 is a schematic enlarged view showing a configuration of a part of FIG. 4.

As shown in FIG. 2, the semiconductor memory device according to the first embodiment includes a semiconductor substrate 100. In the illustrated example, the semiconductor substrate 100 is provided with four memory cell array regions $R_{MCA}$ arranged in the X direction and the Y direction. Each of the four memory cell array regions $R_{MCA}$ is provided with a plurality of memory blocks BLK arranged adjacently in the Y direction. A peripheral region $R_P$ is provided at an end portion of the semiconductor substrate 100 in the Y direction.

In FIG. 3, each of the memory blocks BLK includes string units SU arranged adjacently in the Y direction. An inter-block structure ST is provided between memory blocks BLK adjacent to each other in the Y direction. An inter-string-unit insulating layer SHE is provided between string units SU adjacent to each other in the Y direction.

In FIG. 4, the memory block BLK includes: a plurality of conductive layers 110 arranged adjacently in the Z direction; a plurality of semiconductor pillars 120 extending in the Z direction; and a plurality of gate insulating films 130 each of which is provided between the conductive layers 110 and one of the plurality of semiconductor pillars 120. Further, upper ends of the plurality of semiconductor pillars 120 are respectively connected to via contact electrodes Ch, upper ends of the via contact electrodes Ch are respectively connected to via contact electrodes Vy, and upper ends of the via contact electrodes Vy are connected to a bit line BL.

Each of the conductive layers 110 extends in the X direction. The conductive layer 110 may be a stacked film including a barrier conductive film made of titanium nitride (TiN) or the like and a metal film made of tungsten (W) or the like. In some examples, the conductive layer 110 may comprise polycrystalline silicon or the like doped with an impurity such as phosphorus (P) or boron (B). Insulating layers 101 made of silicon oxide ($SiO_2$) or the like each are provided between adjacent conductive layers 110 in the Z direction. The insulating layer 102 made of silicon oxide ($SiO_2$) or the like is provided above the plurality of conductive layers 110 in the Z direction.

A conductive layer 112 is provided below the conductive layers 110. The conductive layer 112 may comprise, for example, polycrystalline silicon or the like containing an impurity such as phosphorus (P) or boron (B). For example, a conductive layer made of a metal (such as tungsten (W)), tungsten silicide, or the like, or other conductive layers may be provided on a lower surface of the conductive layer 112. The insulating layer 101 is provided between the conductive layer 112 and the conductive layer 110.

The conductive layer 112 functions as the source line SL (FIG. 1). For example, the source line SL is shared by all the memory blocks BLK provided in the memory cell array region $R_{MCA}$ (FIG. 2).

In addition, one or more of the lowermost conductive layers 110 function as the source-side select gate line SGSB (FIG. 1) and the gate electrodes of the plurality of source-side select transistors STSB connected to the source-side select gate line SGSB. In the following description, such a conductive layer 110 may be referred to as a conductive layer 110 (SGSB). Each conductive layer 110 (SGSB) is electrically independent in each of the memory blocks BLK. Each conductive layer 110 (SGSB) includes a plurality of through holes corresponding in position to the plurality of semiconductor pillars 120. Each of inner peripheral surfaces of the plurality of through holes surrounds an outer peripheral surface of the corresponding semiconductor pillar 120 over the entire periphery, and faces the outer peripheral surface of the corresponding semiconductor pillar 120.

One or more conductive layers 110 located above the conductive layer 110 (SGSB) function as the source-side select gate line SGS (FIG. 1) and the gate electrodes of the plurality of source-side select transistors STS connected to the source-side select gate line SGS. In the following description, such a conductive layer 110 may be referred to as a conductive layer 110 (SGS). Each conductive layer 110 (SGS) is electrically independent in each of the memory blocks BLK. Each conductive layer 110 (SGS) includes a plurality of through holes corresponding in position to the plurality of semiconductor pillars 120. Each of inner peripheral surfaces of the plurality of through holes surrounds the outer peripheral surface of the corresponding semiconductor pillar 120 over the entire periphery, and faces the outer peripheral surface of the corresponding semiconductor pillar 120.

A conductive layer 110 located above the conductive layers 110 (SGS) function as a word line WL (FIG. 1) and the gate electrodes of the memory cells MC (FIG. 1) connected to the word line WL. In the following description, such a conductive layer 110 may be referred to as a conductive layer 110 (WL). Each of the conductive layers 110 (WL) is electrically independent in each of the memory blocks BLK. Each of the conductive layer 110 (WL) includes a plurality of through holes corresponding in position to the plurality of semiconductor pillars 120. Each of inner peripheral surfaces of the plurality of through holes surrounds the outer peripheral surface of the corresponding semiconductor pillar 120 over the entire periphery, and faces the outer peripheral surface of the corresponding semiconductor pillar 120.

One or more conductive layers 110 located above the conductive layers 110 (WL) function as the drain-side select gate line SGD and the gate electrodes of the plurality of drain-side select transistors STD (FIG. 1) connected to the drain-side select gate line SGD. In the following description, such a conductive layer 110 may be referred to as a conductive layer 110 (SGD). FIG. 3 also shows the conductive layer 110 (SGDT). The conductive layer 110 (SGD) has the same shape as the conductive layer 110 (SGDT). That is, as shown in FIG. 3, the inter-string-unit insulating layer SHE is provided between two conductive layers 110 (SGD) adjacent to each other in the Y direction. Each of the conductive layers 110 (SGD) is electrically independent in a respective one of the string units SU.

As shown in FIG. 3, a length $Y_{SGD}$ of the conductive layer 110 (SGD) is less than a length $Y_{WL}$ of the conductive layer 110 (WL). In the example of FIG. 3, five conductive layers 110 (SGD) arranged adjacently in the Y direction and four inter-string-unit insulating layers SHE arranged adjacently in the Y direction are provided correspondingly to one conductive layer 110 (WL). Therefore, in the illustrated example, the length $Y_{SGD}$ of the conductive layer 110 (SGD) in the Y direction is less than ⅕ of the length $Y_{WL}$ of the conductive layer 110 (WL) in the Y direction. However, among the five conductive layers 110 (SGD) arranged adjacently in the Y direction correspondingly to one memory block BLK, the length (in the Y direction) of each of the first and fifth conductive layers 110 (SGD) counted from one side in the Y direction may be greater than the length $Y_{SGD}$ of each of other three conductive layers 110 (SGD) in the Y direction, or may be equal to or greater than ⅕ of the length $Y_{WL}$ of the conductive layer 110 (WL) in the Y direction.

Each of the conductive layers 110 (SGD) includes a plurality of through holes 113 corresponding in position to the plurality of semiconductor pillars 120, and a plurality of recess portions 114 corresponding to the plurality of semiconductor pillars 120. Each of inner peripheral surfaces of the plurality of through holes 113 surrounds the outer peripheral surface of the corresponding semiconductor pillar 120 over the entire periphery, and faces the outer peripheral surface of the corresponding semiconductor pillar 120. Each of the plurality of recess portions 114 is connected to a side surface 115 of the conductive layer 110 (SGD) in the Y direction, and faces a part of the outer peripheral surface of the corresponding semiconductor pillar 120.

One or more conductive layers 110 located above the conductive layers 110 (SGD) function as the drain-side select gate line SGDT and the gate electrodes of the plurality of drain-side select transistors STDT (FIG. 1) connected to the drain-side select gate line SGDT. In the following description, such a conductive layer 110 may be referred to as the conductive layer 110 (SGDT). The conductive layer 110 (SGDT) is basically configured in the same manner as the conductive layer 110 (SGD). However, the conductive layers 110 (SGDT) provided in one memory block BLK are electrically connected to each other via a wiring or the like.

As shown in FIG. 3, the semiconductor pillars 120 are arranged in a regular pattern in the X direction and the Y direction. For example, the memory block BLK includes twenty semiconductor pillar rows SC provided from one side to the other side in the Y direction. Each of the semiconductor pillar rows SC includes a plurality of semiconductor pillars 120 arranged adjacently in the X direction. The twenty semiconductor pillar rows SC are arranged at a pitch $P_{SC}$ in the Y direction. That is, for any two semiconductor pillar rows SC adjacent to each other in the Y direction, a central position $Y_{SC}$ of one semiconductor pillar row SC and a central position $Y_{SC}$ of the other semiconductor pillar row SC are separated from each other in the Y direction by a distance equal to the pitch $P_{SC}$.

The pitch $P_{SC}$ can be defined by various methods.

For example, the XY cross section corresponding to the conductive layer 110 (WL) shown in FIG. 3 may be observed by means of SEM, TEM, or the like, central positions $Y_{SC}$ of the twenty semiconductor pillar rows SC corresponding to the memory block BLK may be measured in the XY cross section, the nineteen distances between the twenty central positions $Y_{SC}$ may be measured, and an average value or a median value of the nineteen distances may be taken as the pitch $P_{SC}$ in the particular memory BLK. Furthermore, central positions $Y_{SC}$ of four semiconductor pillar rows SC corresponding to a string unit SU may be measured in the XY cross section, the three distances between the four central positions $Y_{SC}$ may be measured, and an average value or a median value of these three distances may be taken as the pitch $P_{SC}$.

The central position $Y_{SC}$ of the semiconductor pillar row SC in the Y direction can be defined by various methods. For example, the XY cross section shown in FIG. 3 may be observed by means of SEM, TEM, or the like, a central position, in the Y direction, of at least one semiconductor pillar 120 provided in the semiconductor pillar row SC may be measured in the XY cross section, and any central position, an average value of a plurality of central positions, or a median value of the plurality of central positions may be set as the central position $Y_{SC}$ of the particular semiconductor pillar row SC. Further, the central position of the semiconductor pillar 120 in the Y direction may at a center point of a circumscribed circle of the semiconductor pillar 120 in the XY cross section, or may be at a center of gravity of the semiconductor pillar 120 on an image in the XY cross section.

Hereinafter, the semiconductor pillars 120 corresponding to the first, 4n-th (where n is an integer of 1 to 4), (4n+1)-th, and 20-th semiconductor pillar rows SC counted from one side in the Y direction may be referred to as semiconductor pillars $120_O$. Further, the semiconductor pillars 120 corresponding to the second, third, (4n+2)-th, and (4n+3)-th semiconductor pillar rows SC counted from the one side in the Y direction may be referred to as semiconductor pillars $120_I$.

Each of the semiconductor pillars 120 comprise, for example, polycrystalline silicon (Si). The semiconductor pillar 120 shown in FIG. 4 has a substantially cylindrical shape, and is provided, in a central portion thereof, with an insulating layer 127 made of silicon oxide ($SiO_2$) or the like.

The semiconductor pillar 120 includes: a region 121 provided at a lower end thereof; a region 122 facing the one or more conductive layers 110 (SGSB) and the one or more conductive layers 110 (SGS); a region 123 facing the plurality of conductive layers 110 (WL); a region 124 facing the one or more conductive layers 110 (SGD); a region 125 facing the one or more conductive layers 110 (SGDT); and a region 126 provided at an upper end thereof.

The region 121 contains an N-type impurity such as phosphorus (P). The region 121 has a substantially cylindrical shape. The region 121 is connected to the conductive layer 112.

The region 122 functions as channel regions of the source-side select transistors STSB and STS. A lower end portion of the region 122 may contain the N-type impurity such as phosphorus (P). The other portion of the region 122 need not contain the N-type impurity such as phosphorus (P). The region 122 has a substantially cylindrical shape.

The region 123 functions as a channel region of the memory cell MC. The region 123 need not contain the N-type impurity such as phosphorus (P). The region 123 has a substantially cylindrical shape.

The regions 121, 122, and 123 of each of the semiconductor pillars $120_I$ do not overlap with the inter-string-unit insulating layer SHE when viewed from the Z direction. On the other hand, the regions 121, 122, and 123 of each of the semiconductor pillar $120_O$ each include a portion that overlaps with the inter-string-unit insulating layer SHE when viewed from the Z direction.

The region 124 functions as a channel region of the drain-side select transistor STD. The region 124 need not contain the N-type impurity such as phosphorus (P).

In the example of FIG. 3, the semiconductor pillar $120_I$ is spaced from the inter-string-unit insulating layer SHE. The region 124 of the semiconductor pillar $120_I$ has a substantially cylindrical shape. An outer peripheral surface of the region 124 of the semiconductor pillar $120_I$ faces the inner peripheral surface of a respective one of the through holes 113 provided in the conductive layer 110 (SGD).

In the example of FIG. 3, the semiconductor pillar $120_O$ is in contact with the inter-string-unit insulating layer SHE. The region 124 of the semiconductor pillar $120_O$ may have a substantially cylindrical shape, or may have an arc shape when viewed from the Z direction, as shown in FIG. 6. A partial region on an outer peripheral surface of the region 124 of the semiconductor pillar $120_O$ faces the recess portion 114 provided in the conductive layer 110 (SGD). Such a region may be referred to as a region $R_{CH}$. The other region on the outer peripheral surface of the region 124 of the semiconductor pillar $120_O$ is in contact with the inter-string-unit insulating layer SHE. Such a region may be referred to as a region $R_{EG}$.

In the XY cross section shown in FIG. 6, a length $Y_{120O}$ of the semiconductor pillar $120_O$ in the Y direction is less than a length $Y_{120I}$ of the semiconductor pillar $120_I$ in the Y direction. A cross-sectional area $S_{120O}$ of the semiconductor pillar $120_O$ is less than a cross-sectional area $S_{120I}$ of the semiconductor pillar $120_I$.

The region 125 (FIG. 4) functions as a channel region of the drain-side select transistor STDT. An upper end portion of the region 125 may contain the N-type impurity such as phosphorus (P). The other portion of the region 125 need not contain the N-type impurity such as phosphorus (P). The region 125 of the semiconductor pillar $120_I$ has a substantially cylindrical shape. The region 125 of the semiconductor pillar $120_O$ may have a substantially cylindrical shape, or may have an arc shape when viewed from the Z direction.

The region 126 (FIG. 4) contains the N-type impurity such as phosphorus (P). The region 126 has a substantially columnar shape. The region 126 is connected to a lower end of a respective one of the via contact electrodes Ch.

Each of the gate insulating films 130 has a substantially cylindrical shape that covers the outer peripheral surface of the semiconductor pillar 120. For example, as shown in FIG. 5, the gate insulating film 130 includes a tunnel insulating film 131, a charge storage film 132, and a block insulating film 133 which are stacked between the semiconductor pillar 120 and the conductive layers 110. Each of the tunnel insulating film 131 and the block insulating film 133 comprises, for example, silicon oxide ($SiO_2$). The charge storage film 132 is, for example, a film which is capable of storing charges and which is made of silicon nitride (SiN) or the like. Each of the tunnel insulating film 131, the charge storage film 132, and the block insulating film 133 has a substantially cylindrical shape, and extends in the Z direction along the outer peripheral surface of the semiconductor pillar 120 excluding a partial region. For example, as shown in FIG. 4, the tunnel insulating film 131, the charge storage film 132, and the block insulating film 133 are not provided at a contact portion between the semiconductor pillar 120 and the conductive layer 112. For example, as shown in FIGS. 6 and 7, the tunnel insulating film 131, the charge storage film 132, and the block insulating film 133 need not be provided in the region $R_{EG}$ of the outer peripheral surface of the semiconductor pillar $120_O$.

FIG. 5 shows an example in which the gate insulating film 130 includes the charge storage film 132 made of silicon nitride or the like. However, the gate insulating film 130 may include a floating gate which is made of polycrystalline silicon or the like containing an N-type or P-type impurity.

The via contact electrodes Ch each may include, for example, a stacked film including a barrier conductive film made of titanium nitride (TiN) or the like and a metal film made of tungsten (W) or the like.

As shown in FIG. 3, the via contact electrodes Ch are arranged in a predetermined pattern in the X direction and the Y direction correspondingly to the semiconductor pillars 120. FIG. 3 shows 20 via contact electrode rows ChC provided from one side to the other side in the Y direction. Each of the 20 via contact electrode rows ChC includes the plurality of via contact electrodes Ch arranged adjacently in the X direction.

Hereinafter, the via contact electrodes Ch corresponding to the first, 4n-th, (4n+1)-th, and 20-th via contact electrode rows ChC counted from one side in the Y direction may be referred to as via contact electrodes $Ch_O$. Further, the via contact electrodes Ch corresponding to the second, third, (4n+2)-th, and (4n+3)-th via contact electrode rows ChC counted from the one side in the Y direction may be referred to as via contact electrodes $Ch_I$.

For example, a central position, in the Y direction, of the via contact electrode row ChC including the via contact electrodes $Ch_I$ is set as a central position $Y_{ChCI}$. For the plurality of via contact electrodes $Ch_O$ arranged adjacently in the X direction, a central position, in the Y direction, of a plurality of circumscribed circles $C_{Ch}$ corresponding to the plurality of via contact electrodes $Ch_O$ is set as a central position $Y_{ChCO}$. In this case, the plurality of central positions $Y_{ChCI}$ and $Y_{ChCO}$ are arranged adjacently at the pitch $P_{SC}$ in the Y direction. That is, adjacent central positions among the plurality of central positions $Y_{ChCI}$ and $Y_{ChCO}$ are separated from each other in the Y direction by a distance equal to the pitch $P_{SC}$.

The central position $Y_{ChCI}$, in the Y direction, of the via contact electrode row ChC including the via contact electrodes $Ch_I$ can be defined by various methods. For example, the XY cross section including the via contact electrodes $Ch_I$ may be observed by means of SEM, TEM, or the like, a central position, in the Y direction, of at least one via contact electrode $Ch_I$ provided in a via contact electrode row ChC may be measured in the XY cross section, and any central position, an average value of the plurality of central positions, or a median value of the plurality of central positions may be taken as the central position $Y_{ChCI}$ of the via contact electrode row ChC in the Y direction. The central position of the via contact electrode $Ch_I$ in the Y direction may be at a center point of a circumscribed circle of the via contact electrode $Ch_I$ in the XY cross section, or may at a center of gravity of the via contact electrode $Ch_I$ on an image in the XY cross section.

The above central position $Y_{ChCO}$ corresponding to the via contact electrode $Ch_O$ can also be defined by substantially the same method as that of the central position $Y_{ChCI}$. However, the central position $Y_{ChCO}$ is not a central position of the via contact electrode $Ch_O$ in the Y direction, but is defined based on the central position, in the Y direction, of the circumscribed circle $C_{Ch}$ of the via contact electrode $Ch_O$.

In an example of FIG. 6, the via contact electrode $Ch_I$ is spaced from the inter-string-unit insulating layer SHE. The via contact electrode $Ch_I$ has a substantially circular shape when viewed from the Z direction.

On the other hand, in the example of FIG. 6, the via contact electrode $Ch_O$ is in contact with the inter-string-unit insulating layer SHE. The via contact electrode $Ch_O$ has a partly missing circular shape when viewed from the Z direction. In the example of FIG. 6, a part of an outer peripheral surface of the via contact electrode $Ch_O$ is formed along the circumscribed circle $C_{Ch}$ of the via contact electrode $Ch_O$. Such a region may be referred to as a region $R_C$. Further, the other region of the outer peripheral surface of the via contact electrode $Ch_O$ is provided inside the circumscribed circle $C_{Ch}$ and is in contact with the inter-string-unit insulating layer SHE. Hereinafter, such a region may be referred to as a region $R_I$. In this example, a curvature of an outer peripheral surface of the region $R_C$ and a curvature of an outer peripheral surface of the region $R_I$ in the via contact electrode $Ch_O$ are different from each other.

In the XY cross section shown in FIG. 6, a length $Y_{ChO}$ of the via contact electrode $Ch_O$ is less than a length $Y_{ChI}$ of the via contact electrode $Ch_I$. A cross-sectional area $S_{ChO}$ of the via contact electrode $Ch_O$ is less than a cross-sectional area $S_{ChI}$ of the via contact electrode $Ch_I$.

In the XY cross section shown in FIG. 6, the region $R_I$ of the outer peripheral surface of each via contact electrode $Ch_O$ extends in the X direction, and the regions $R_I$ of the outer peripheral surfaces of the plurality of via contact electrodes $Ch_O$ provided in one via contact electrode row ChC are arranged adjacently along the X direction. In a YZ cross section shown in FIG. 7, the region $R_{EG}$ of the outer peripheral surface of the semiconductor pillar $120_O$ is continuous with the region $R_I$ of the outer peripheral surface of the via contact electrode $Ch_O$.

As shown in FIGS. 6 and 7, the inter-string-unit insulating layer SHE extends in the X direction and the Z direction. The inter-string-unit insulating layer SHE comprises, for example, silicon oxide ($SiO_2$). A length $Y_{SHE}$ (FIG. 6) of the inter-string-unit insulating layer SHE is less than the length $Y_{SGD}$ (FIG. 3) of each of the conductive layer 110 (SGD) and the conductive layer 110 (SGDT). Further, the length $Y_{SHE}$ (FIG. 6) of the inter-string-unit insulating layer SHE is less than the pitch $P_{SC}$ (FIG. 3) of the plurality of semiconductor pillar rows SC in the Y direction. The inter-string-unit insulating layer SHE is disposed between the semiconductor pillars $120_O$ provided in two adjacent semiconductor pillar rows SC, but the inter-string-unit insulating layer SHE is not itself provided with through holes corresponding to the semiconductor pillars 120.

A length $Z_{SHE}$ (FIG. 7) of the inter-string-unit insulating layer SHE in the Z direction is greater than a length $Z_{SGD}$ of the conductive layer 110 (SGD) in the Z direction. As shown in FIG. 7, a lower end of the inter-string-unit insulating layer SHE is located above a lower surface of an uppermost conductive layer 110 (WL). The lower end of the inter-string-unit insulating layer SHE is located below a lower surface of a lowermost conductive layer 110 (SGD). An upper end of the inter-string-unit insulating layer SHE is provided above the upper end of the via contact electrode Ch. Therefore, for example, when a position of the upper end of the inter-string-unit insulating layer SHE in the Z direction is set as $P_{ZSHE}$, a position of the upper end of the via contact electrode Ch in the Z direction is set as $P_{ZCh}$, and a position of an upper surface of the conductive layer 110 (SGDT) in the Z direction is set as $P_{ZSGDT}$, a distance $D_1$ between the position $P_{ZSHE}$ and the position $P_{ZSGDT}$ is greater than a distance $D_2$ between the position $P_{ZCh}$ and the position $P_{ZSGDT}$.

As shown in FIGS. 3 and 4, the inter-block structure ST includes a conductive layer 141 extending in the X direction and the Z direction, and insulating layers 142 made of silicon oxide ($SiO_2$) or the like and provided on side surfaces of the conductive layer 141 in the Y direction. A lower end of the conductive layer 141 is connected to the conductive layer 112. Further, an upper end of the conductive layer 141 is located above the upper end of the semiconductor pillar 120 and below the upper end of the via contact electrode Ch. The conductive layer 141 may comprise a stacked film including a barrier conductive film made of titanium nitride (TiN) or the like and a metal film made of tungsten (W) or the like. Further, the conductive layer 141 may comprise, for example, polycrystalline silicon or the like containing an impurity (dopant) such as phosphorus (P) or boron (B). The conductive layer 141 functions, for example, as a part of the source line SL (FIG. 1).

As shown in FIG. 3, the bit lines BL extend in the Y direction and are arranged adjacently in the X direction. A pitch of the bit lines BL in the X direction is half a pitch, in the X direction, of the semiconductor pillars 120 in the semiconductor pillar row SC. Each of the bit lines BL may include, for example, a stacked film including a barrier conductive film made of titanium nitride (TiN) or the like and a metal film made of copper (Cu) or the like. The above via contact electrodes Vy are provided at positions where the bit line BL and the via contact electrodes Ch overlap with each other when viewed from the Z direction.

[Manufacturing Method]

Next, a method for manufacturing the semiconductor memory device according to the first embodiment will be described with reference to FIGS. 8 to 23. Each of FIGS. 8 to 23 is a schematic cross-sectional view illustrating the manufacturing method, and shows a cross section corresponding to FIG. 4.

Figure 8:
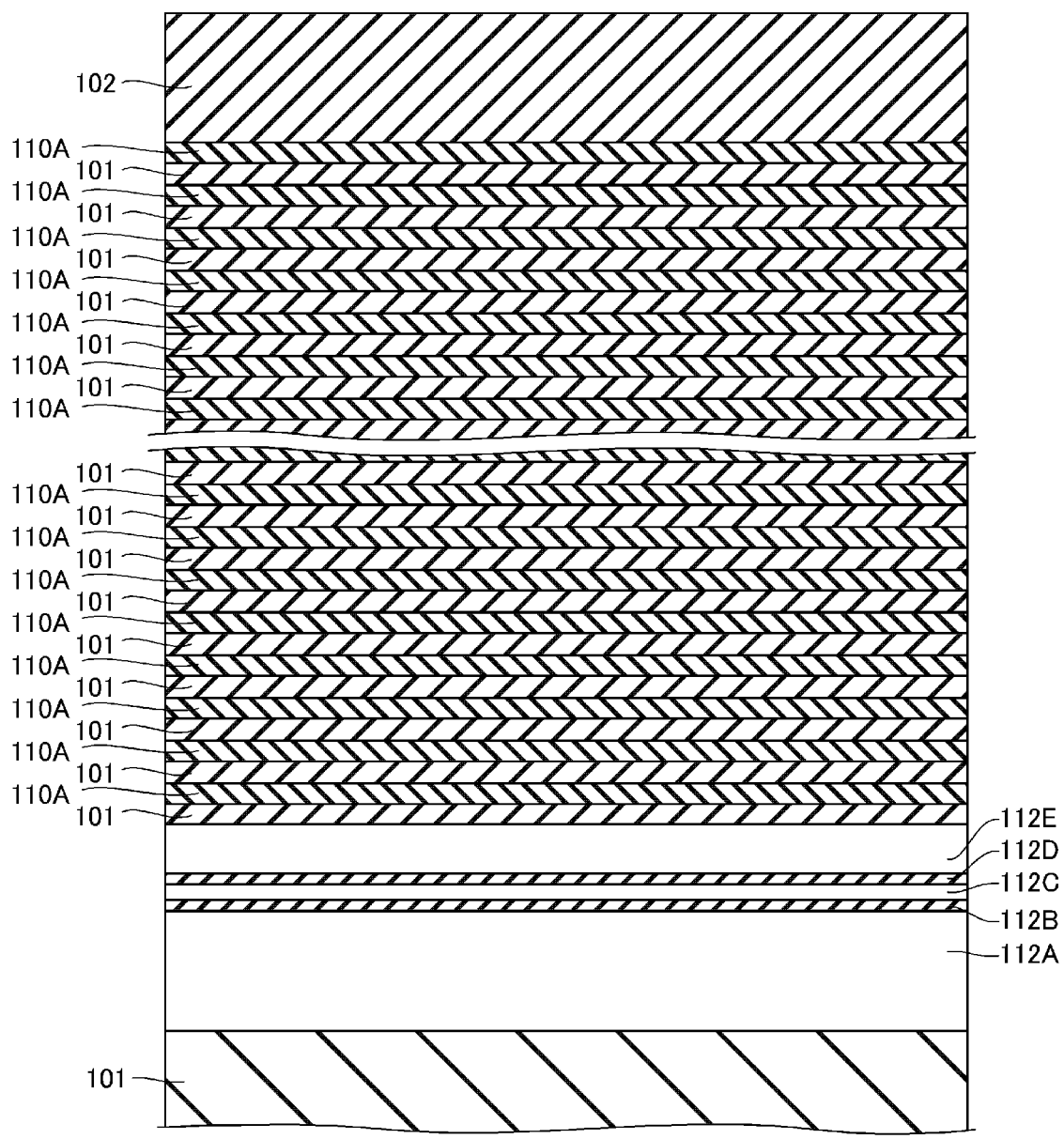
FIGS. 8 to 23 are schematic cross-sectional views illustrating aspects of a method for manufacturing a semiconductor memory device according to a first embodiment.

When a memory die MD according to the present embodiment is manufactured, the insulating layer 101 is formed above a semiconductor substrate (not shown), for example, as shown in FIG. 8. Next, a semiconductor layer 112A made of silicon or the like, a sacrifice layer 112B made of silicon oxide or the like, a sacrifice layer 112C made of silicon or the like, a sacrifice layer 112D made of silicon oxide or the like, and a semiconductor layer 112E made of silicon or the like are formed on the insulating layer 101. Further, the plurality of insulating layers 101 and a plurality of sacrifice layers 110A are alternately formed. Further, a part of the insulating layer 102 is formed. The step is performed by a method such as chemical vapor deposition (CVD).

Figure 9:
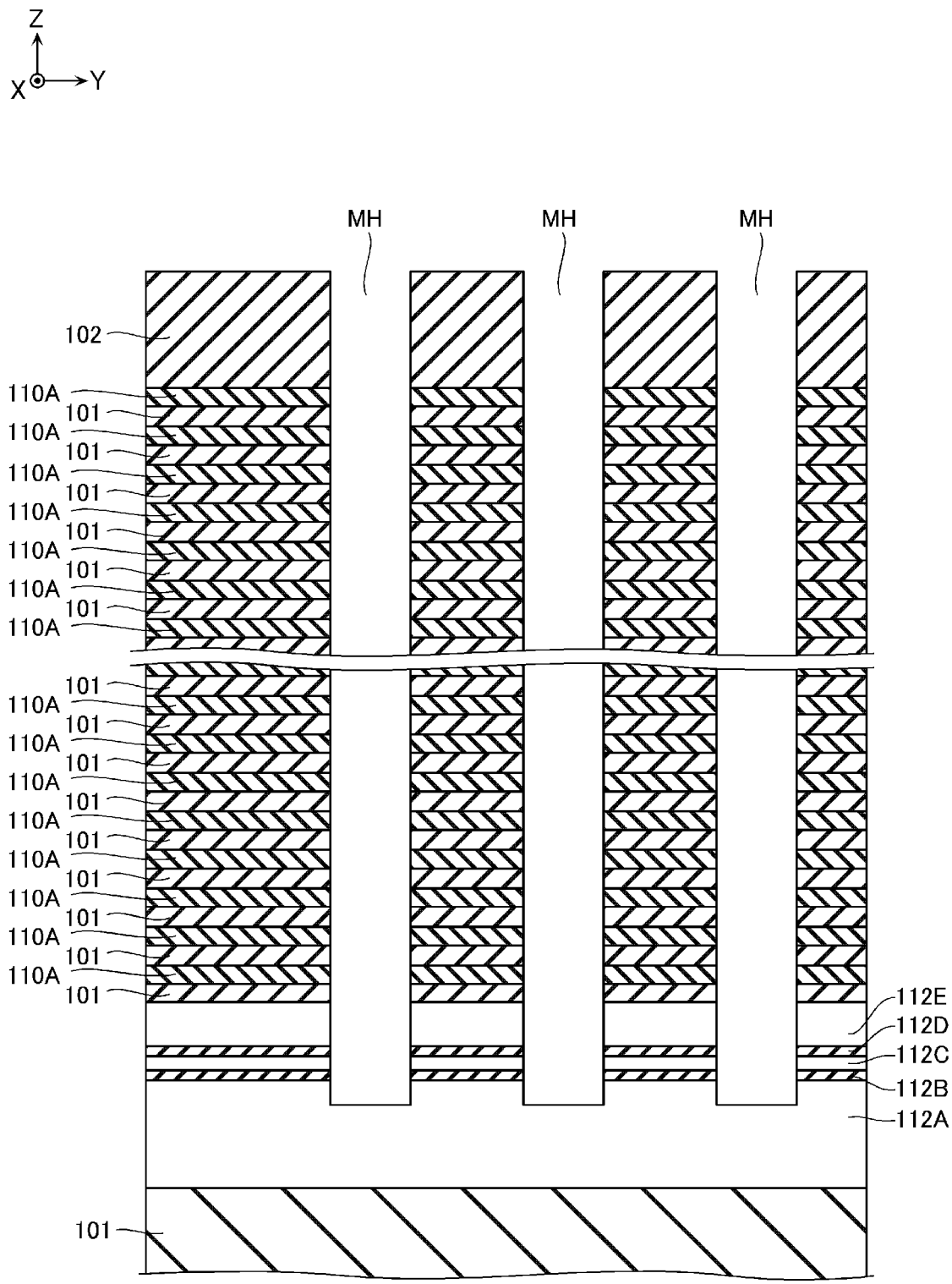

Next, for example, as shown in FIG. 9, memory holes MH are formed at positions corresponding to the semiconductor pillars 120. Each of the memory holes MH extends in the Z direction, penetrates the insulating layer 102, the insulating layers 101, the sacrifice layers 110A, the semiconductor layer 112E, the sacrifice layer 112D, the sacrifice layer 112C, and the sacrifice layer 112B, and exposes an upper surface of the semiconductor layer 112A. The step is performed by a method such as RIE.

Figure 10:
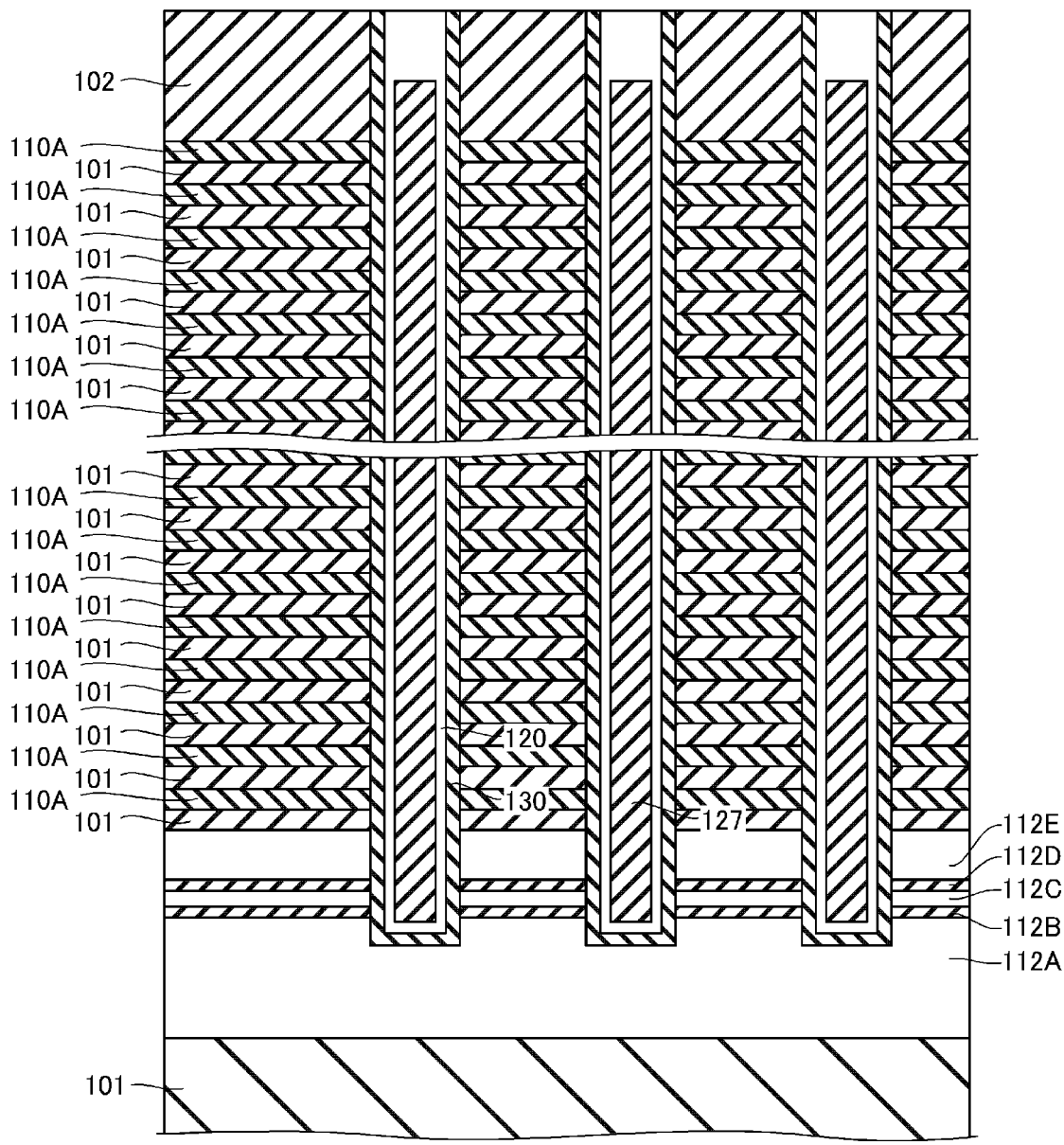

Next, for example, as shown in FIG. 10, the gate insulating film 130, the semiconductor pillar 120, and the insulating layer 127 are formed in the memory hole MH. The step is performed by a method such as CVD.

Figure 11:
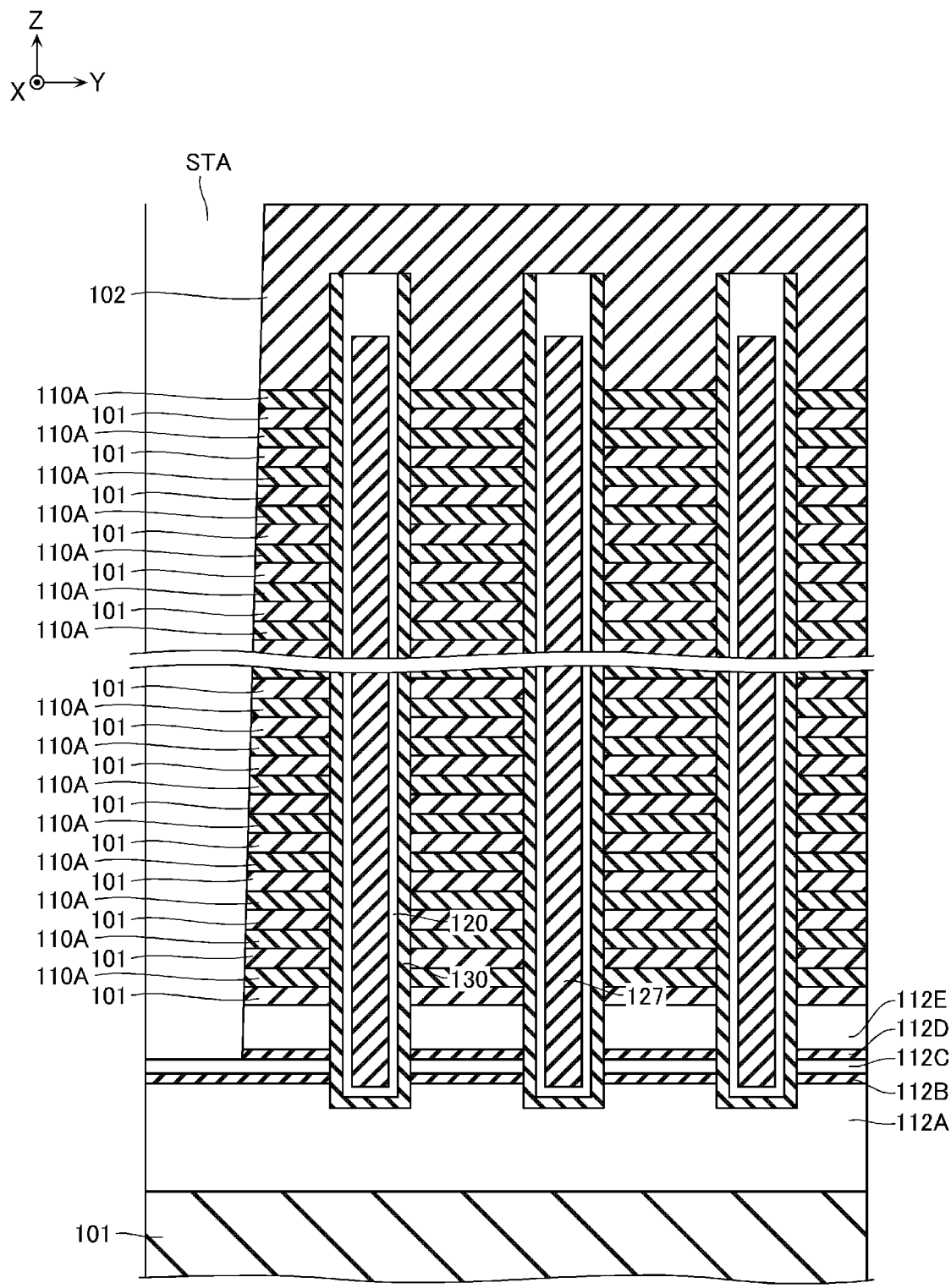

Next, for example, as shown in FIG. 11, a part of the insulating layer 102 is formed by a method such as CVD. Further, a groove STA is formed at a position corresponding to the inter-block structure ST. The groove STA extends in the Z direction and the X direction, divides the insulating layer 102, the insulating layers 101, the sacrifice layers 110A, the semiconductor layer 112E, and the sacrifice layer 112D in the Y direction, and exposes an upper surface of the sacrifice layer 112C. The step is performed by a method such as RIE.

Figure 12:
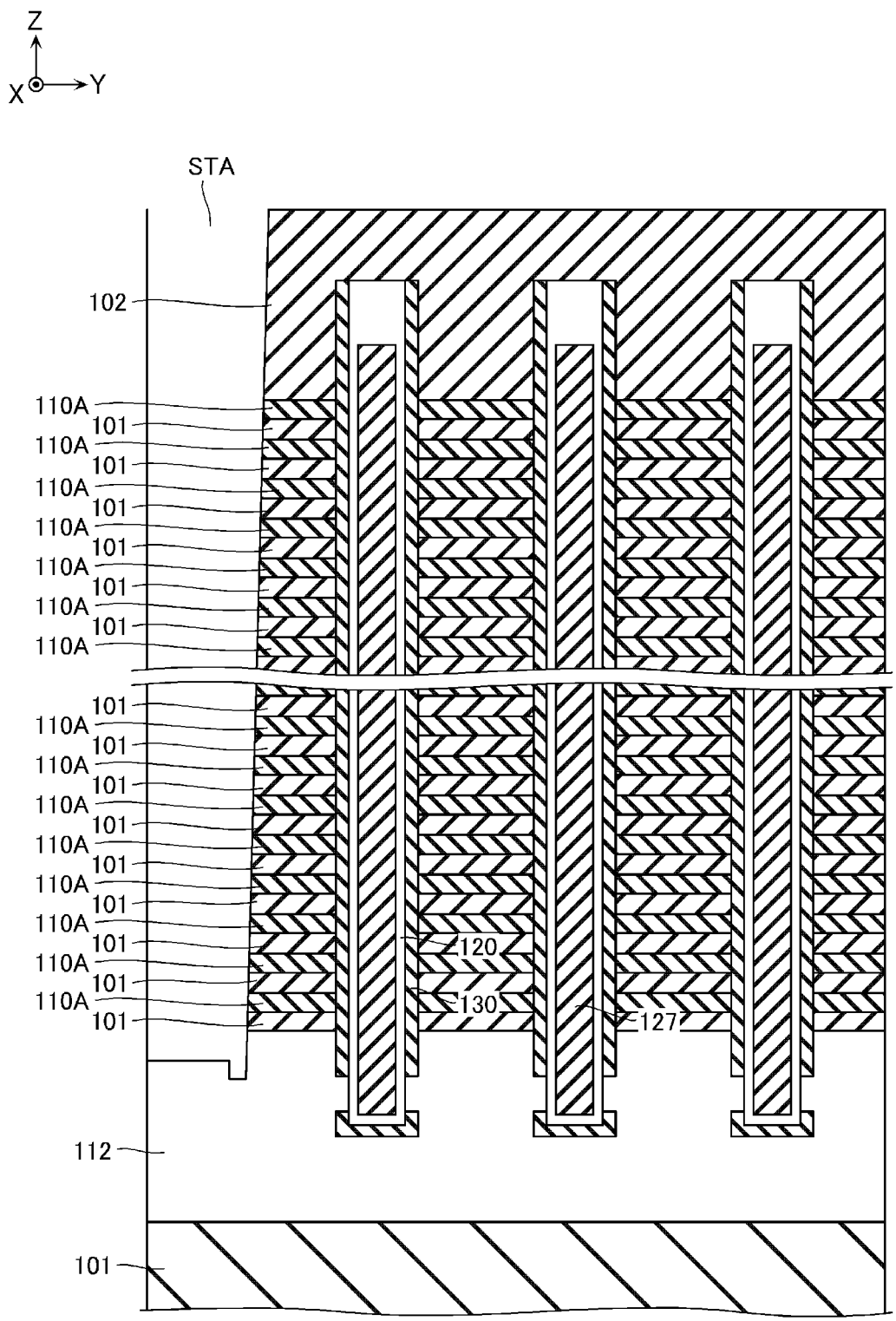

Next, for example, as shown in FIG. 12, the sacrifice layer 112B, the sacrifice layer 112C, the sacrifice layer 112D, and a part of the gate insulating film 130 are removed to form the conductive layer 112. The removal of the sacrifice layer 112B, the sacrifice layer 112C, the sacrifice layer 112D, and a part of the gate insulating film 130 is performed by a method such as wet etching. The formation of the conductive layer 112 is performed by a method such as epitaxial growth.

Figure 13:
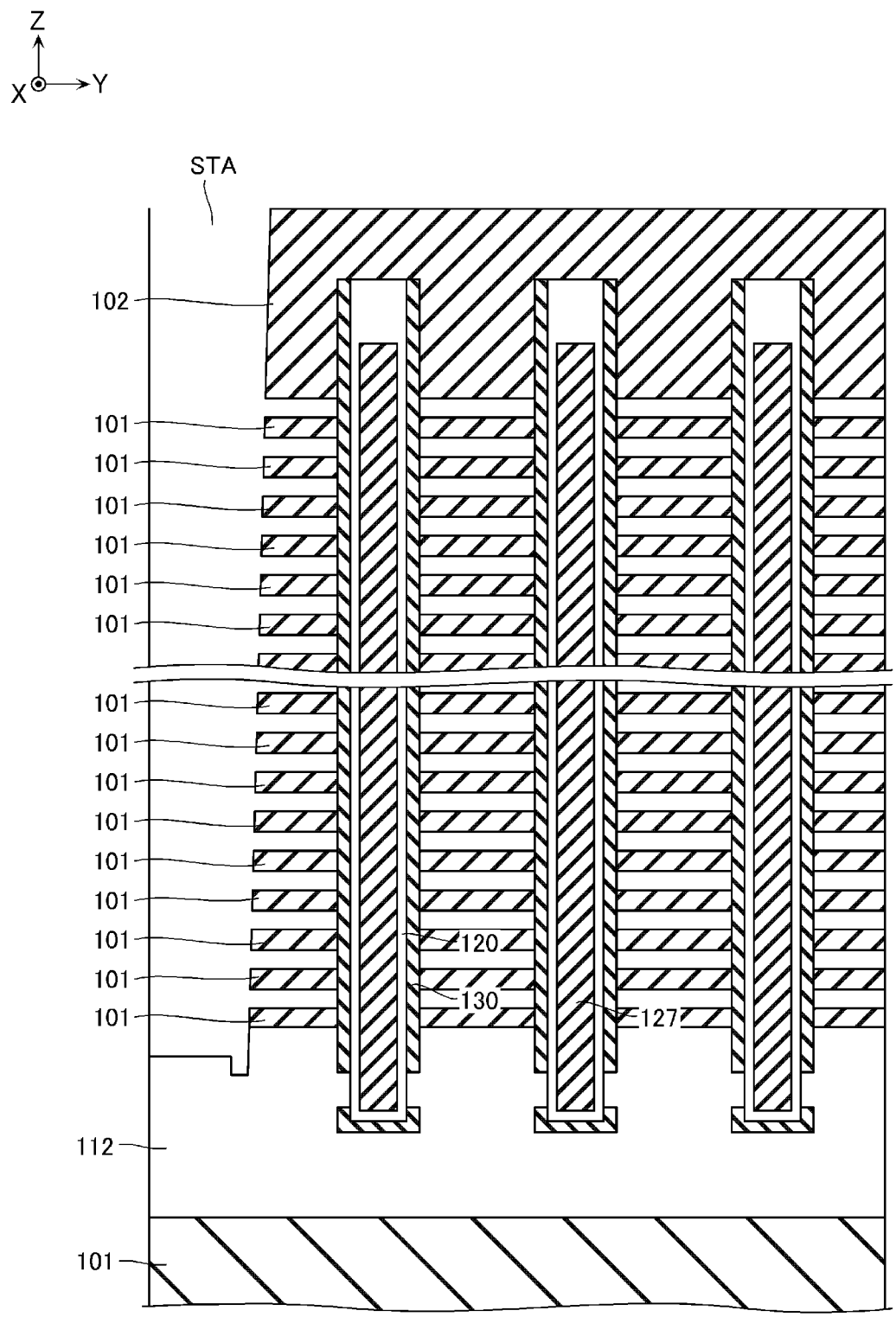

Next, for example, as shown in FIG. 13, the sacrifice layers 110A are removed through the groove STA. As a result, a hollow structure is formed, which includes the plurality of insulating layers 101 and the insulating layer 102 arranged adjacently in the Z direction, and a structure (the semiconductor pillar 120, the gate insulating film 130, and the insulating layer 127) in the memory hole MH supporting the insulating layers 101 and the insulating layer 102. The step is performed by a method such as wet etching.

Figure 14:
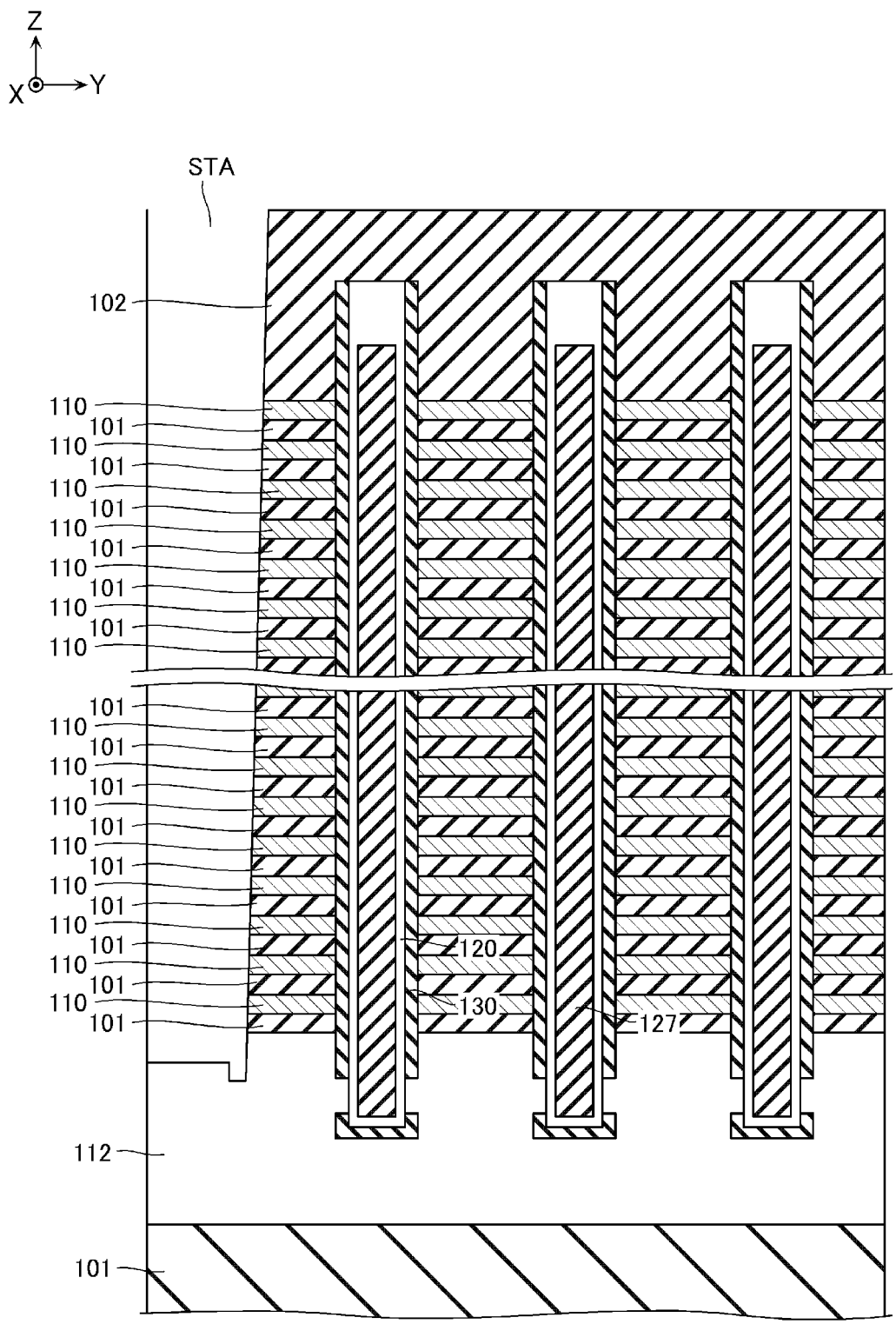

Next, for example, as shown in FIG. 14, the conductive layers 110 are respectively formed in spaces created by removing the sacrifice layers 110A. The step is performed by a method such as CVD.

Figure 15:
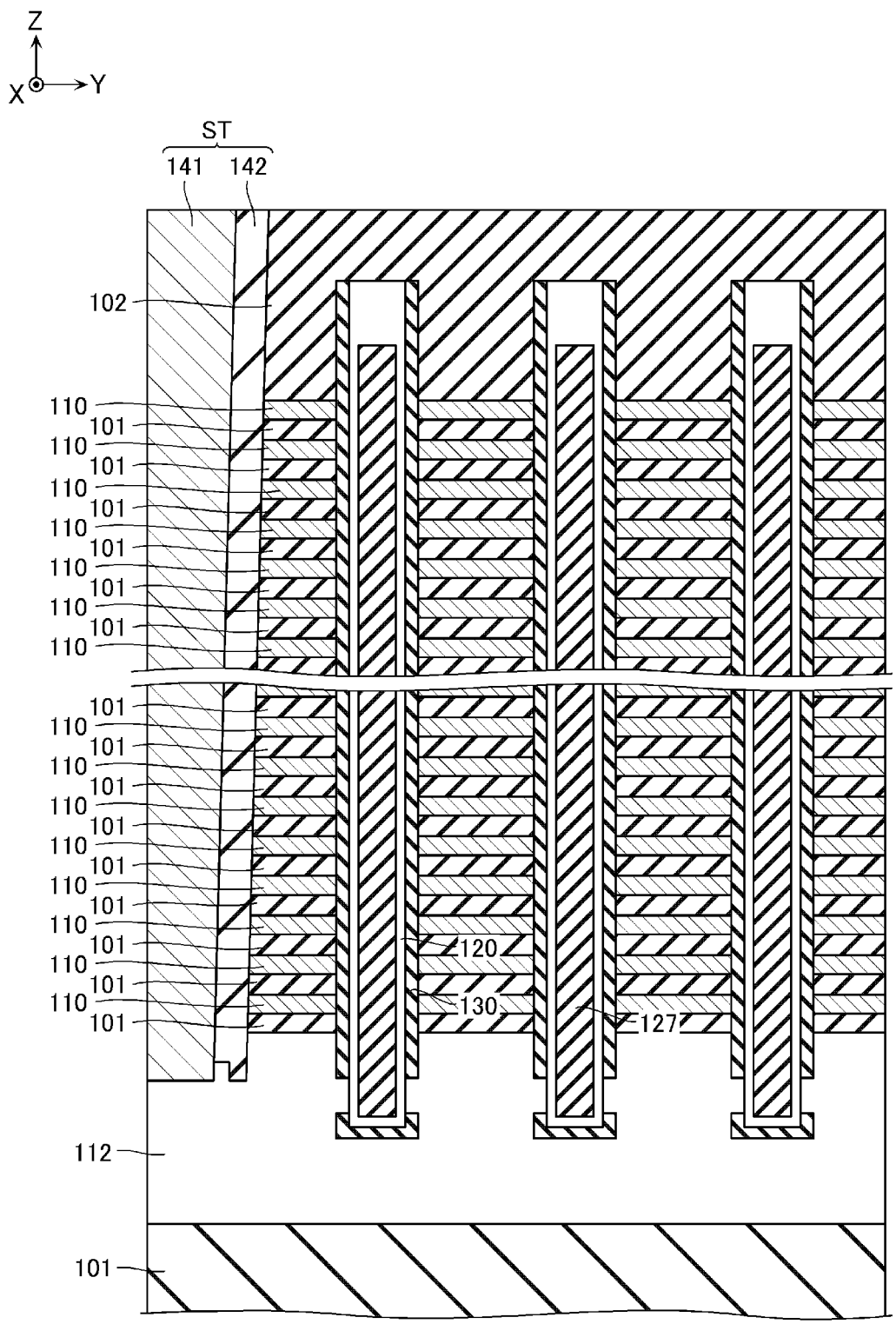

Next, for example, as shown in FIG. 15, the inter-block structure ST is formed in the groove STA. The step is performed by methods such as CVD and RIE.

Figure 16:
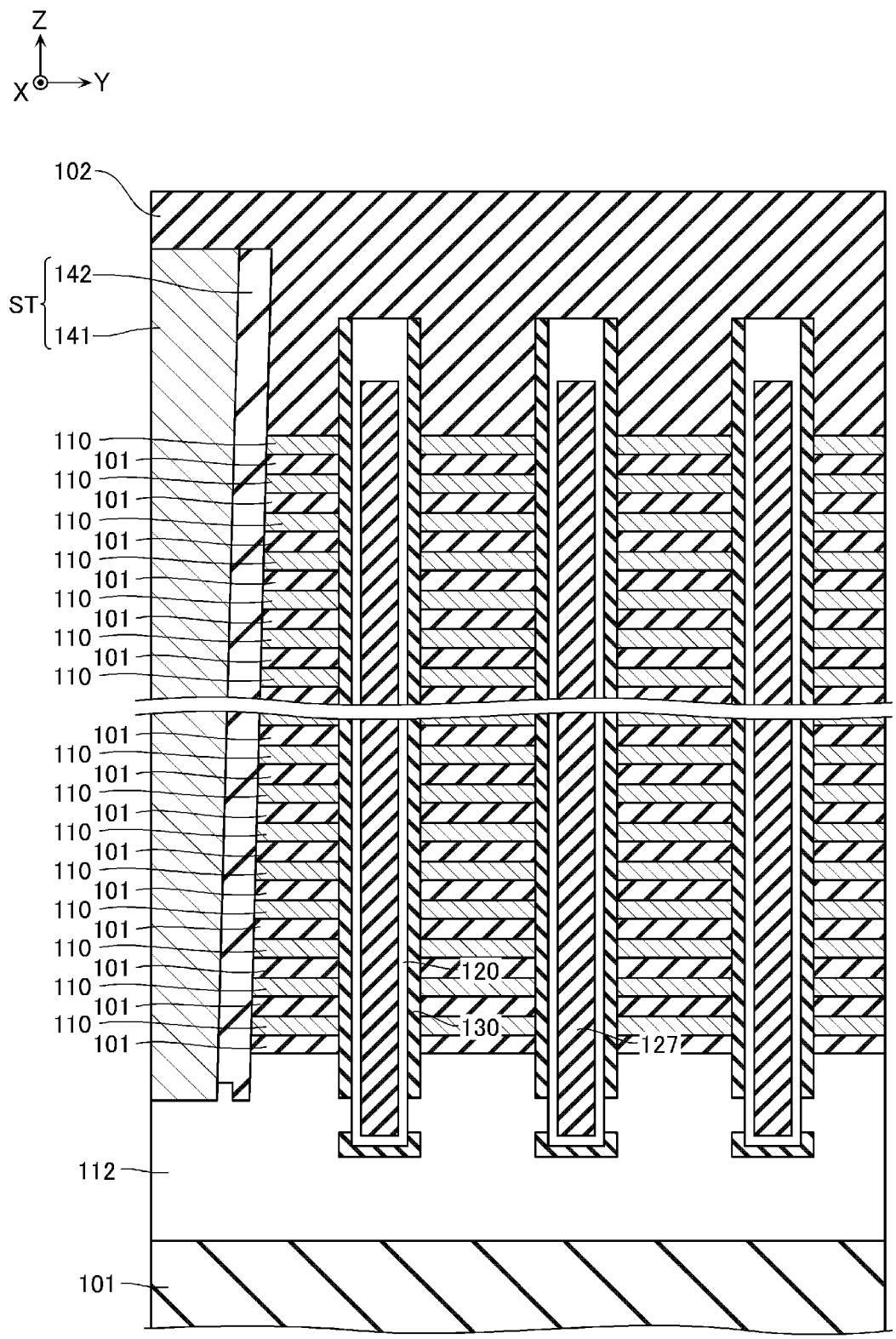

Next, for example, as shown in FIG. 16, a part of the insulating layer 102 is formed by a method such as CVD.

Figure 17:
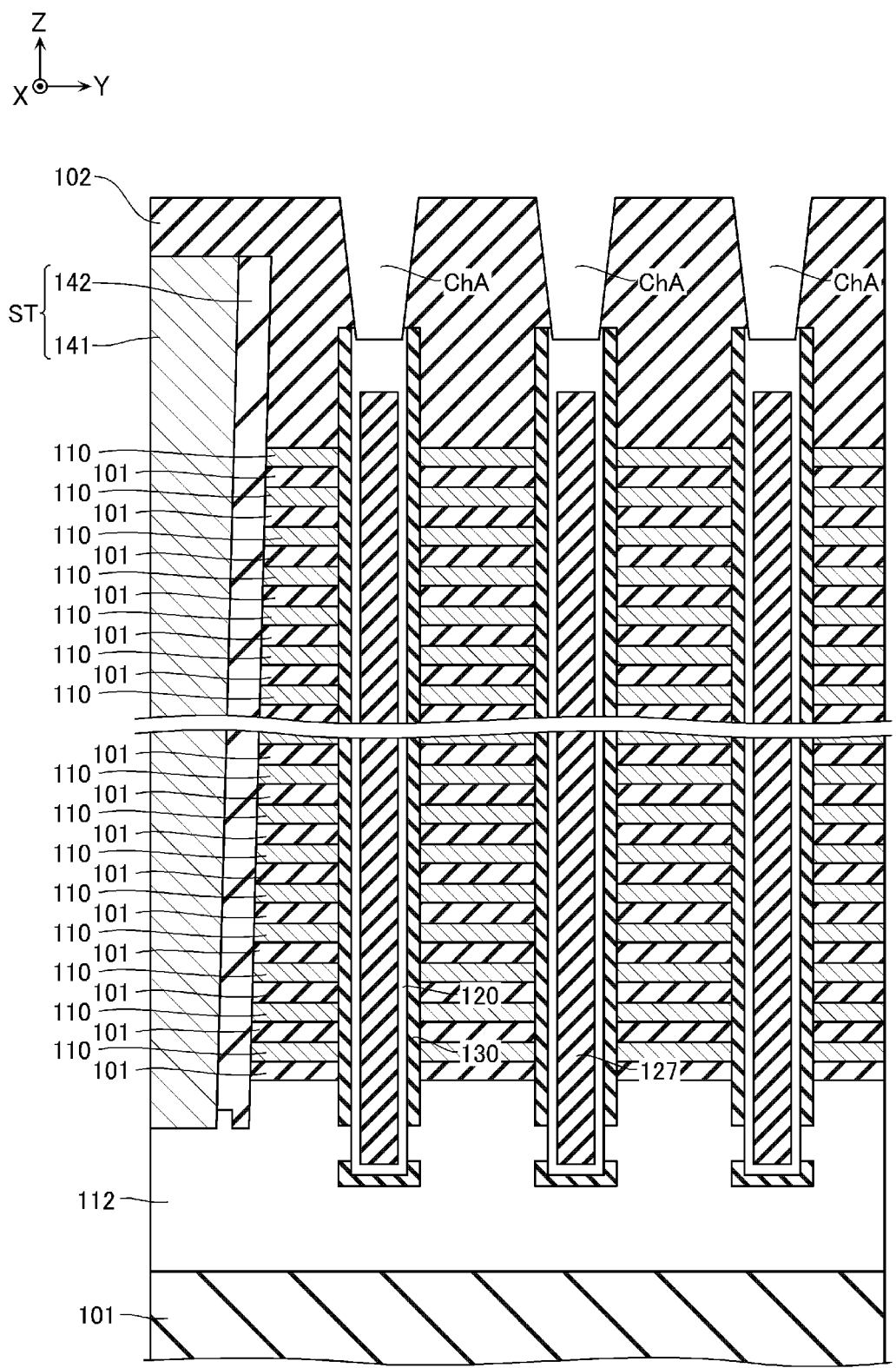

Next, for example, as shown in FIG. 17, contact holes ChA are formed at positions corresponding to the via contact electrodes Ch. Each of the contact holes ChA extends in the Z direction, penetrates the insulating layer 102, and exposes an upper surface of the semiconductor pillar 120. The step is performed by a method such as RIE.

Figure 18:
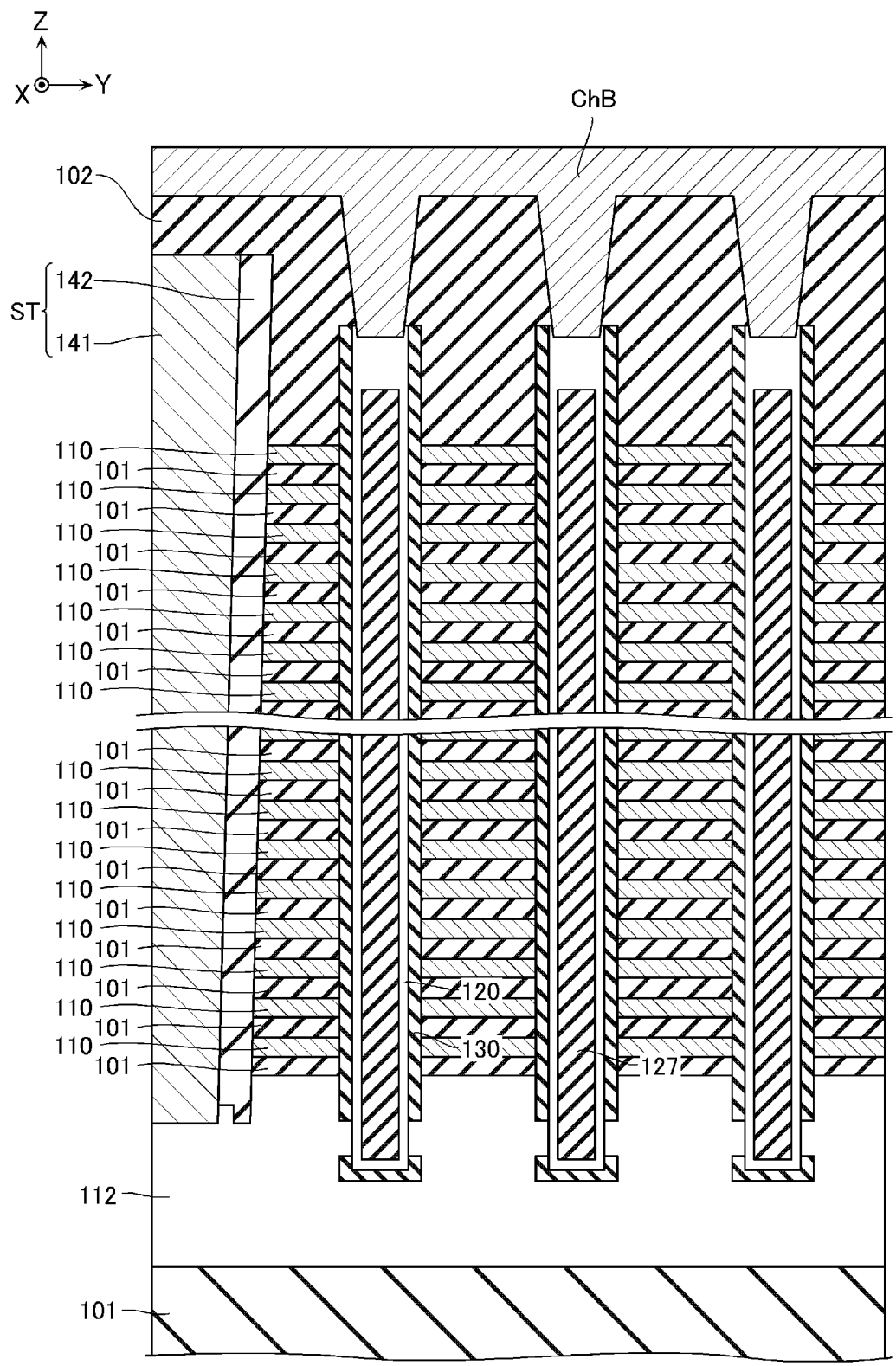

Next, for example, as shown in FIG. 18, a conductive layer ChB is formed on an upper surface of the insulating layer 102 and in the contact holes ChA. The step is performed by a method such as CVD.

Figure 19:
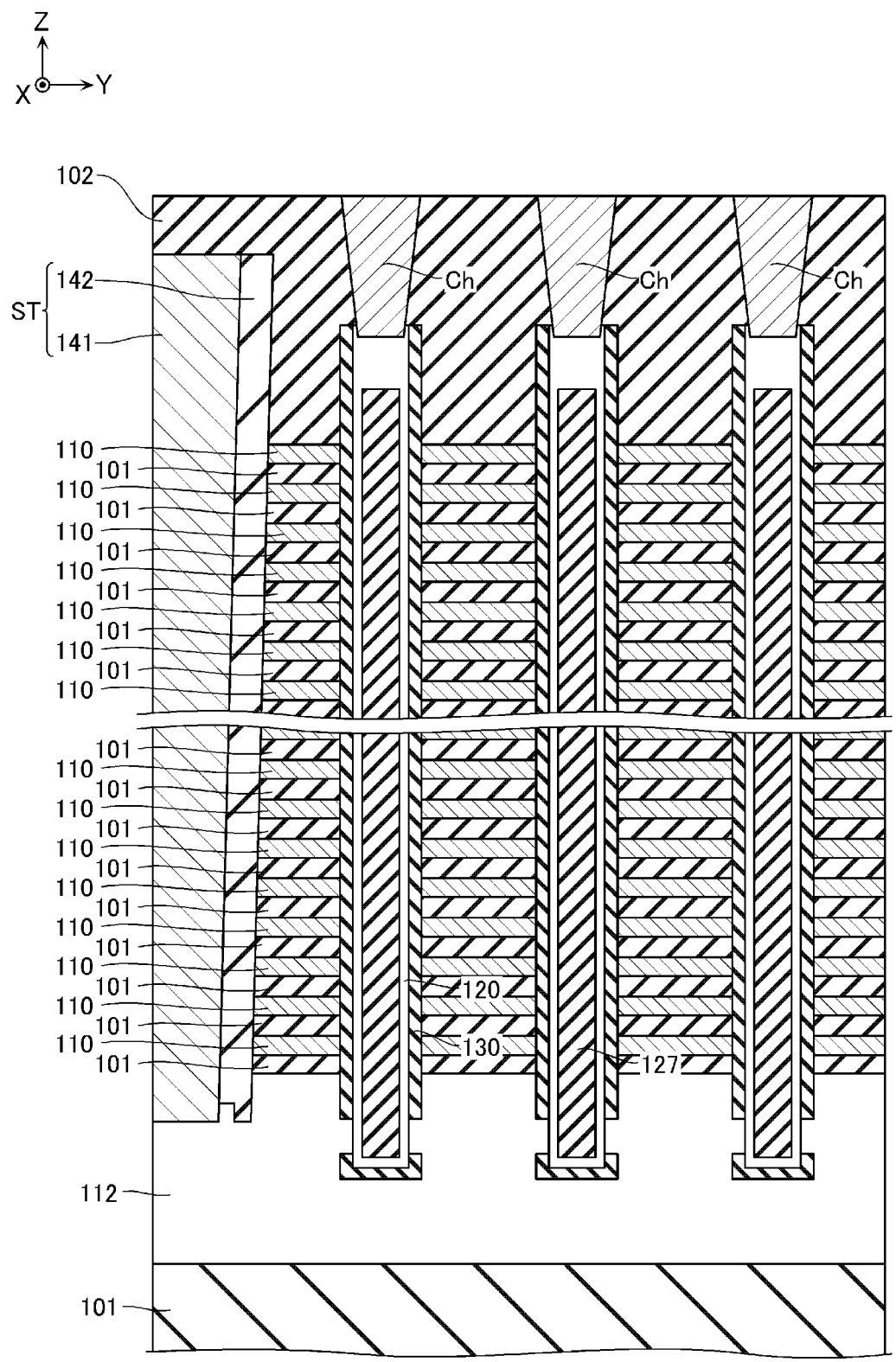

Next, for example, as shown in FIG. 19, a part of the conductive layer ChB is removed. A portion of the conductive layer ChB, which is formed on the upper surface of the insulating layer 102, is removed in the step. In addition, portions formed in the contact holes ChA remain and serve as the via contact electrodes Ch. The step is performed by a method such as chemical mechanical polishing (CMP).

Figure 20:
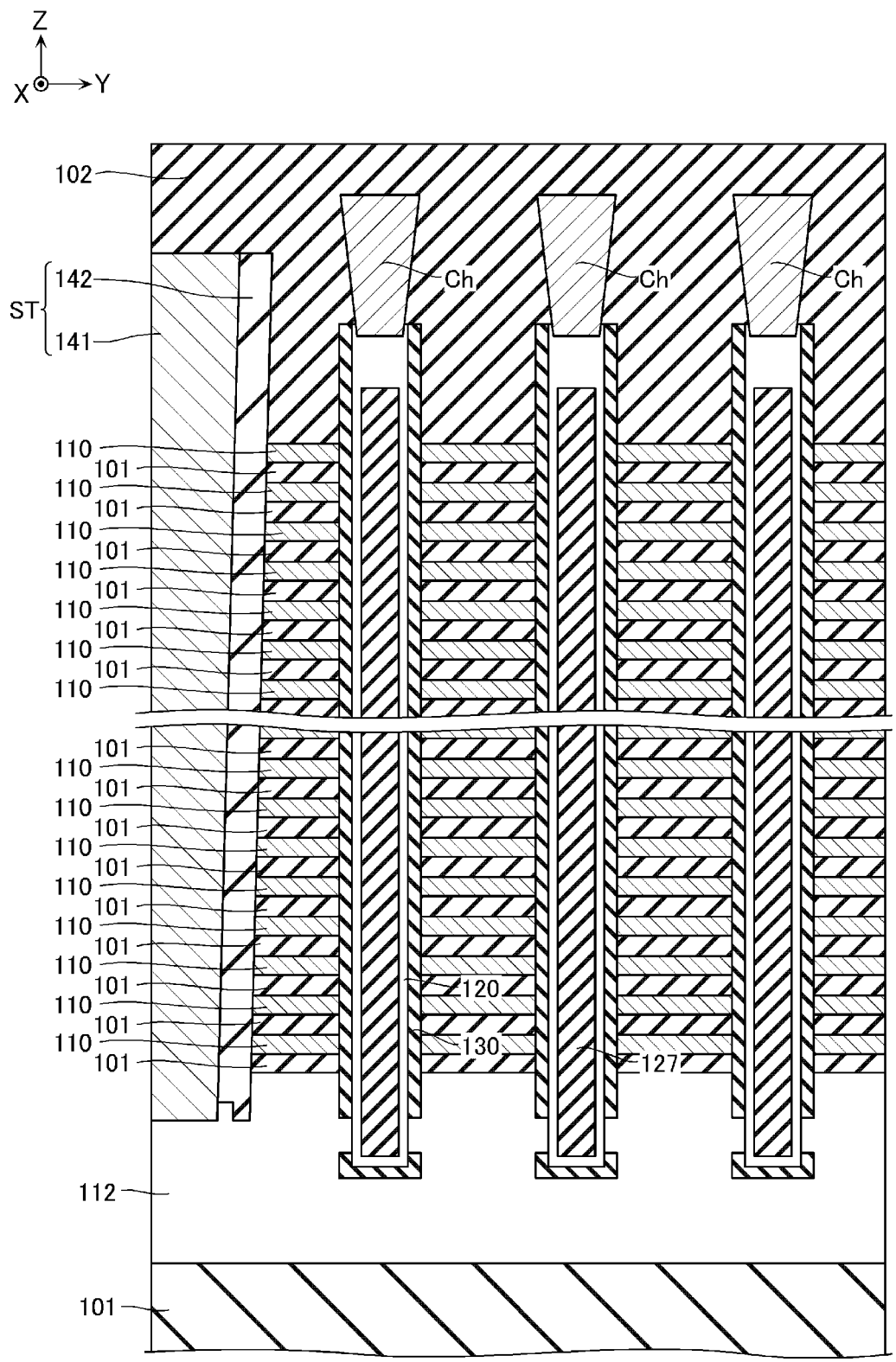

Next, for example, as shown in FIG. 20, a part of the insulating layer 102 is formed by a method such as CVD.

Figure 21:
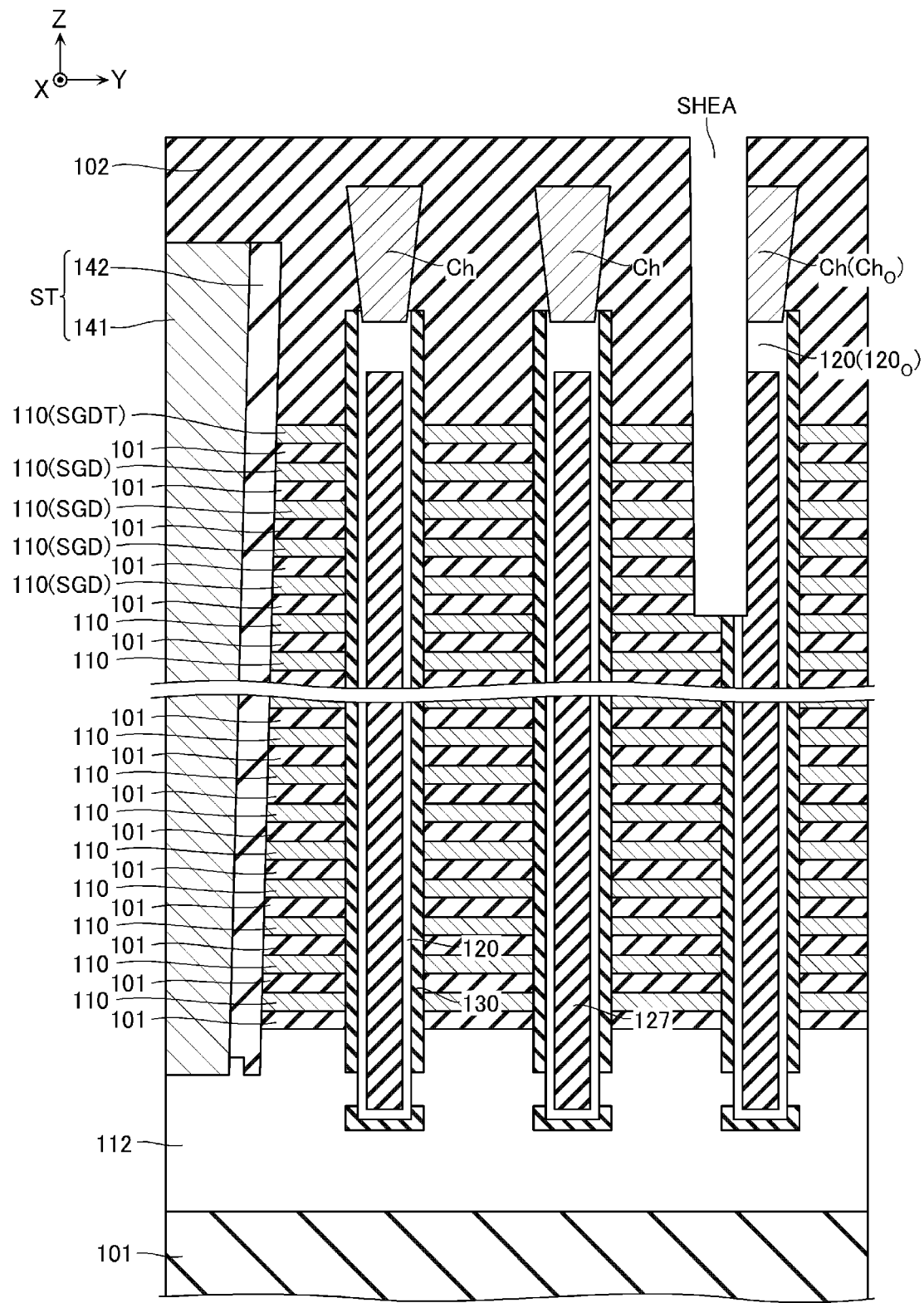

Next, for example, as shown in FIG. 21, a groove SHEA is formed at a position corresponding to the inter-string-unit insulating layer SHE. The groove SHEA extends in the Z direction and the X direction, and divides, in the Y direction, the insulating layer 102, the conductive layer 110 (SGDT), the conductive layers 110 (SGD), and the insulating layers 101 provided between these conductive layers 110. The step is performed by a method such as RIE.

A part of the semiconductor pillar $120_O$ and a part of the via contact electrode $Ch_O$ are removed in the step. As a result, as described with reference to FIG. 6, each of the regions 124 and 125 (FIG. 4) of the semiconductor pillar $120_O$ may have the arc shape when viewed from the Z direction. As described with reference to FIG. 6, the via contact electrode $Ch_O$ may have the partly missing circular shape when viewed from the Z direction. An exposed surface of the semiconductor pillar $120_O$ to the groove SHEA is the region $R_{EG}$ described with reference to FIGS. 6 and 7. An exposed surface of the via contact electrode $Ch_O$ to the groove SHEA is the region $R_I$ described with reference to FIGS. 6 and 7. In an example of FIG. 21, a part of a contact surface between the via contact electrode $Ch_O$ and the semiconductor pillar $120_O$ is removed with the formation of the groove SHEA. In such a case, the region $R_{EG}$ of the outer peripheral surface of the semiconductor pillar $120_O$ is continuous with the region $R_I$ of the outer peripheral surface of the via contact electrode $Ch_O$.

Figure 22:
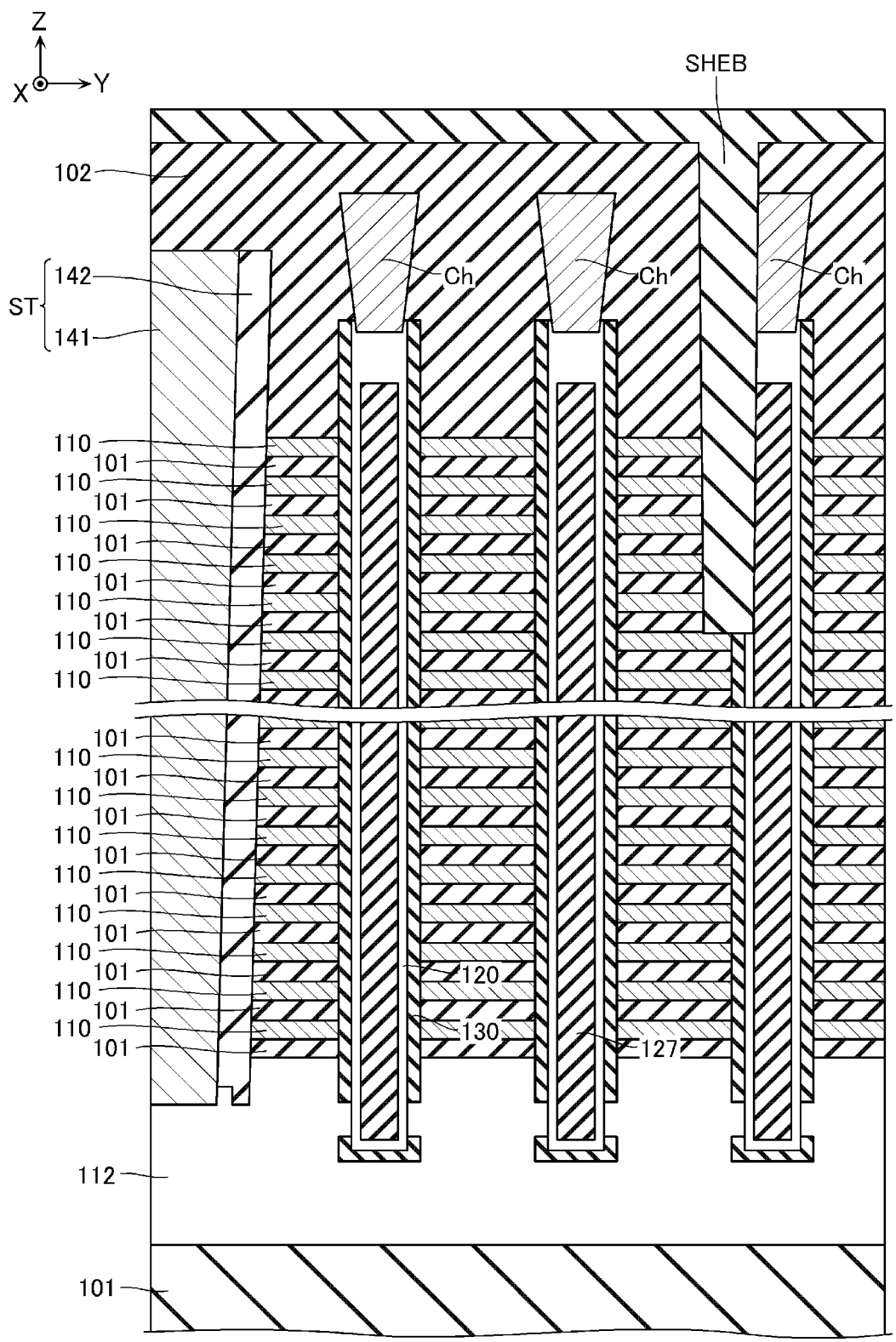

Next, for example, as shown in FIG. 22, an insulating layer SHEB is formed on an upper surface of the insulating layer 102 and in the groove SHEA. The step is performed by a method such as CVD.

Figure 23:
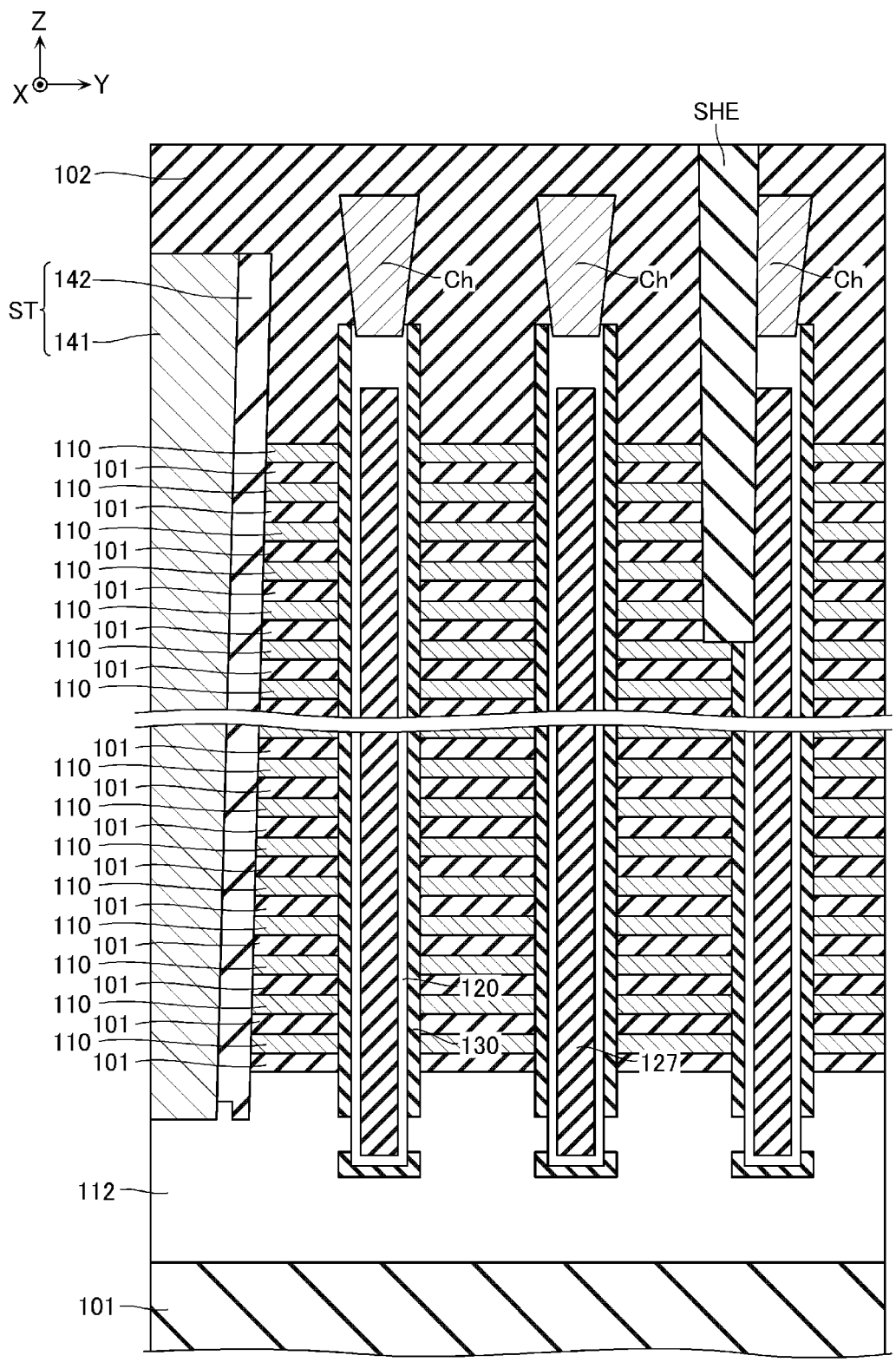

Next, for example, as shown in FIG. 23, a part of the insulating layer SHEB is removed. A portion of the insulating layer SHEB, which is formed on the upper surface of the insulating layer 102, is removed in the step. In addition, a portion formed in the groove SHEA remains and serves as the inter-string-unit insulating layer SHE. The step is performed by a method such as RIE. The step may be omitted.

Thereafter, a structure described with reference to FIG. 4 is formed by forming the via contact electrodes Vy and the bit line BL.

Comparative Example

Configuration

Figure 24:
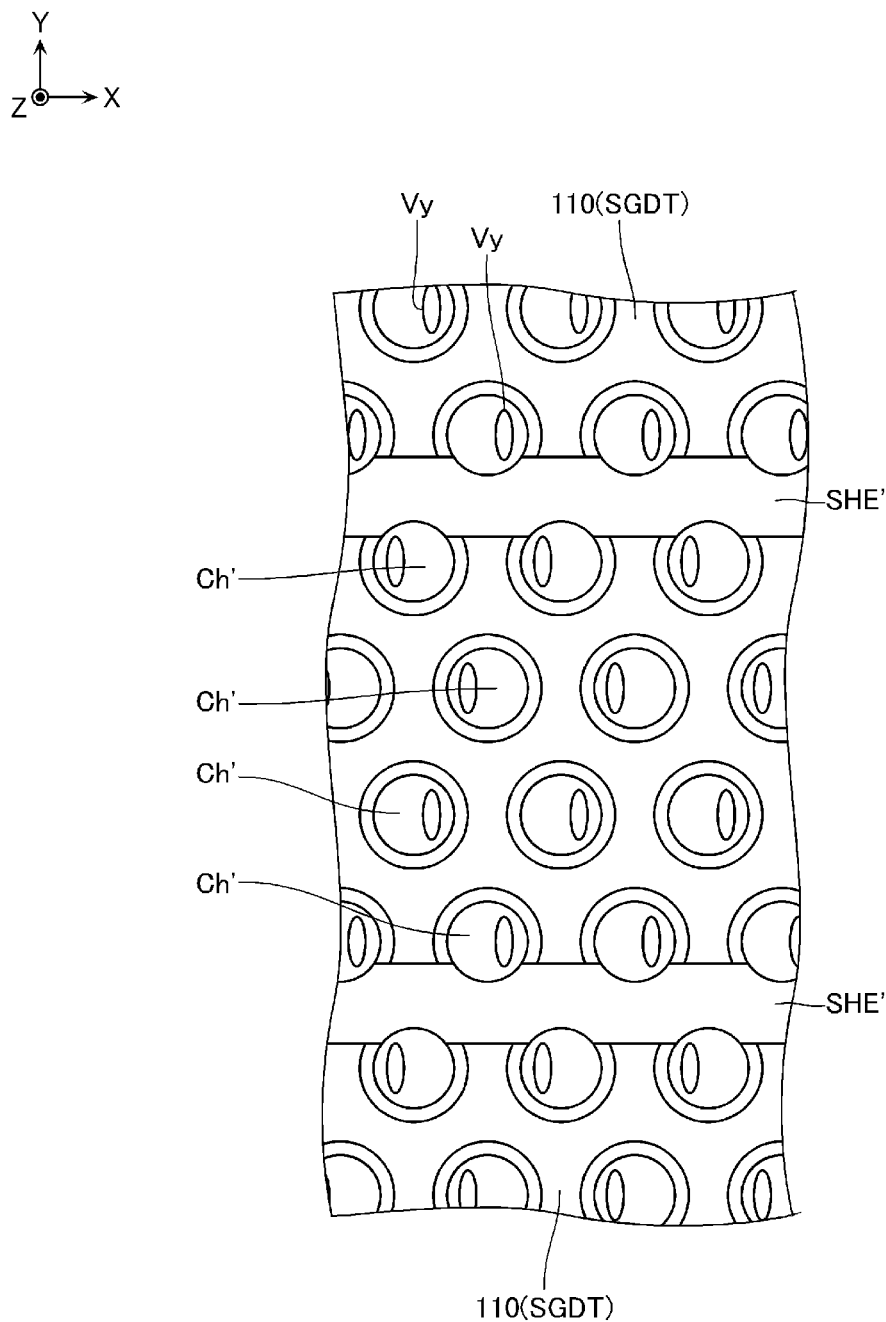
FIG. 24 is a schematic plan view showing a configuration of a part of a semiconductor memory device according to a comparative example.
Figure 25:
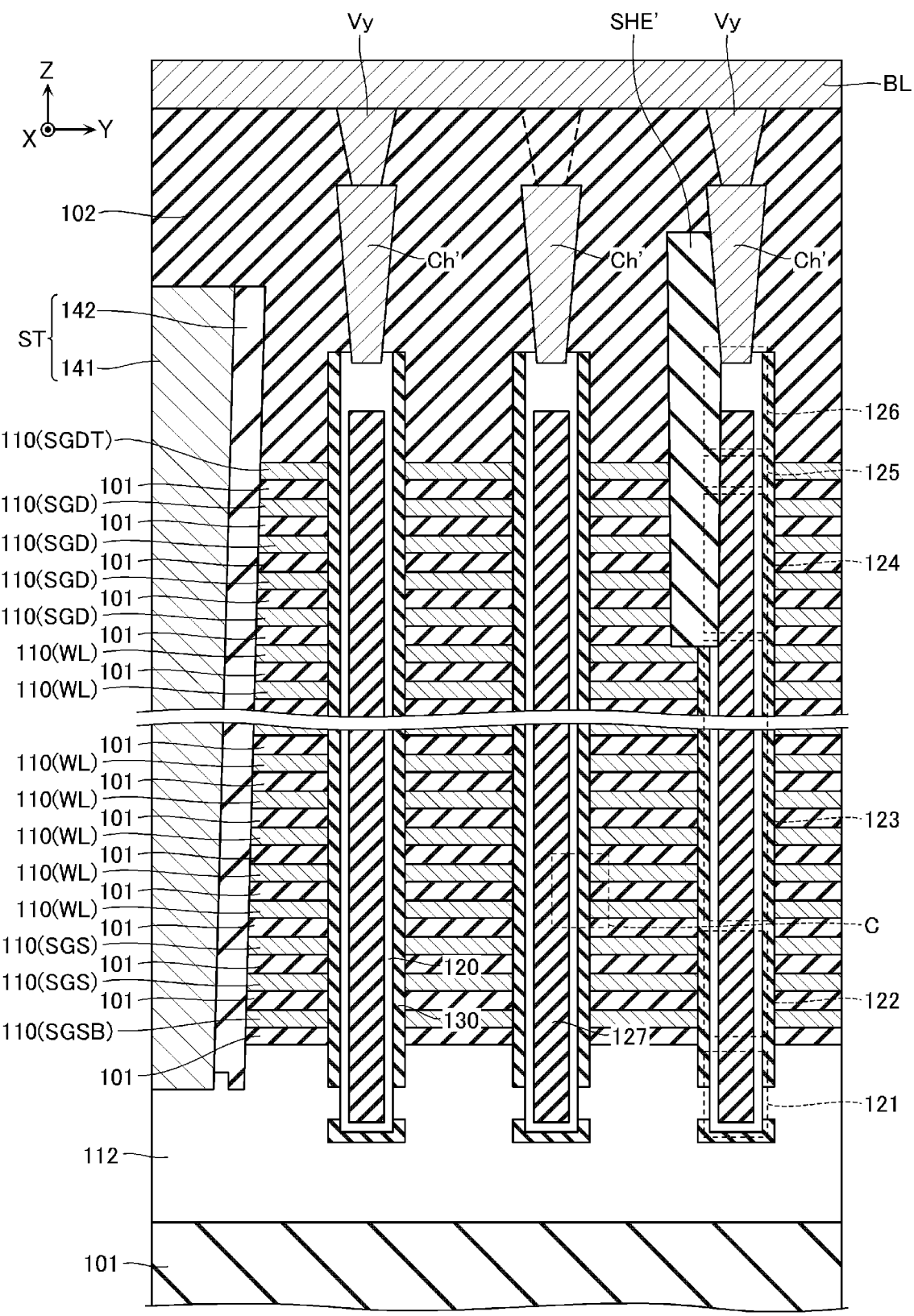
FIG. 25 is a schematic cross-sectional view showing a configuration of a part of the semiconductor memory device according to the comparative example.

Next, a configuration of a semiconductor memory device according to a comparative example will be described with reference to FIGS. 24 and 25. FIG. 24 is a schematic plan view showing a configuration of a part of the semiconductor memory device according to the comparative example. FIG. 24 shows a plane with the bit lines BL and the insulating layer 102 omitted. FIG. 25 is a schematic cross-sectional view showing a configuration of a part of the semiconductor memory device according to the comparative example.

The semiconductor memory device according to the comparative example includes via contact electrodes Ch' instead of the via contact electrodes Ch. Further, the semiconductor memory device includes inter-string-unit insulating layers SHE' instead of the inter-string-unit insulating layers SHE.

In the semiconductor memory device according to the comparative example, the inter-string-unit insulating layer SHE' is formed before formation of the via contact electrode Ch'.

Therefore, the via contact electrode Ch' does not have a partly missing circular shape when the inter-string-unit insulating layer SHE' is formed. Therefore, in the semiconductor memory device according to the comparative example, as shown in FIG. 24, each of the via contact electrodes Ch' has a substantially circular shape when viewed from the Z direction. A part of the via contact electrodes Ch' are in contact with the inter-string-unit insulating layers SHE'.

As shown in FIG. 25, an upper end of the via contact electrode Ch' is provided above an upper end of the inter-string-unit insulating layer SHE' in the semiconductor memory device according to the comparative example.

[Effects of Semiconductor Memory Device According to First Embodiment]

Figure 26:
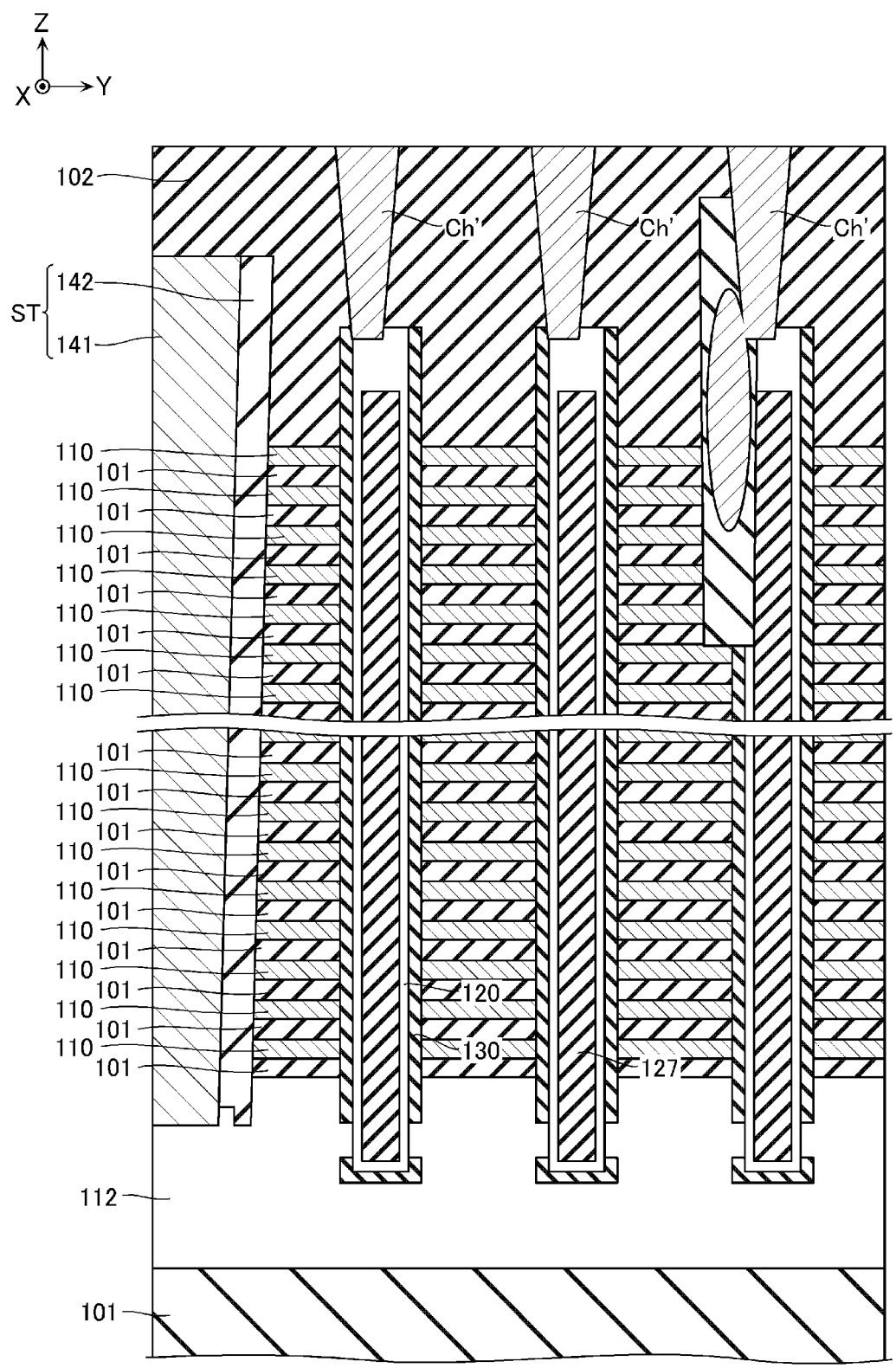
FIG. 26 is a schematic cross-sectional view illustrating aspects of a method for manufacturing the semiconductor memory device according to the comparative example.

Next, effects of the semiconductor memory device according to the first embodiment will be described with reference to FIG. 26. FIG. 26 is a schematic cross-sectional view illustrating a method for manufacturing the semiconductor memory device according to the comparative example.

When the semiconductor memory device according to the comparative example is manufactured, the inter-string-unit insulating layer SHE' cannot be embedded in the entire groove SHEA, and thus a gap may be formed. The gap communicates with a contact hole corresponding to the via contact electrode Ch', and thus when the via contact electrode Ch' is formed, a conductive layer made of tungsten (W) or the like may be formed in the gap, for example, as shown in FIG. 26. In such a case, a leak current may be generated between the via contact electrode Ch', and the conductive layers 110 (SGD) and 110 (SGDT), via the conductive layer formed in the gap.

When the semiconductor memory device according to the first embodiment is being manufactured, the via contact electrode Ch is formed in the steps described with reference to FIGS. 17 to 19, and the inter-string-unit insulating layer SHE is then formed in the steps described with reference to FIGS. 21 to 23. Therefore, even if the gap is formed in the groove SHEA as described with reference to FIG. 21, the conductive layer is not formed in the gap when the via contact electrode Ch is formed. Therefore, generation of the leak current as described above can be avoided.

Second Embodiment

Figure 27:
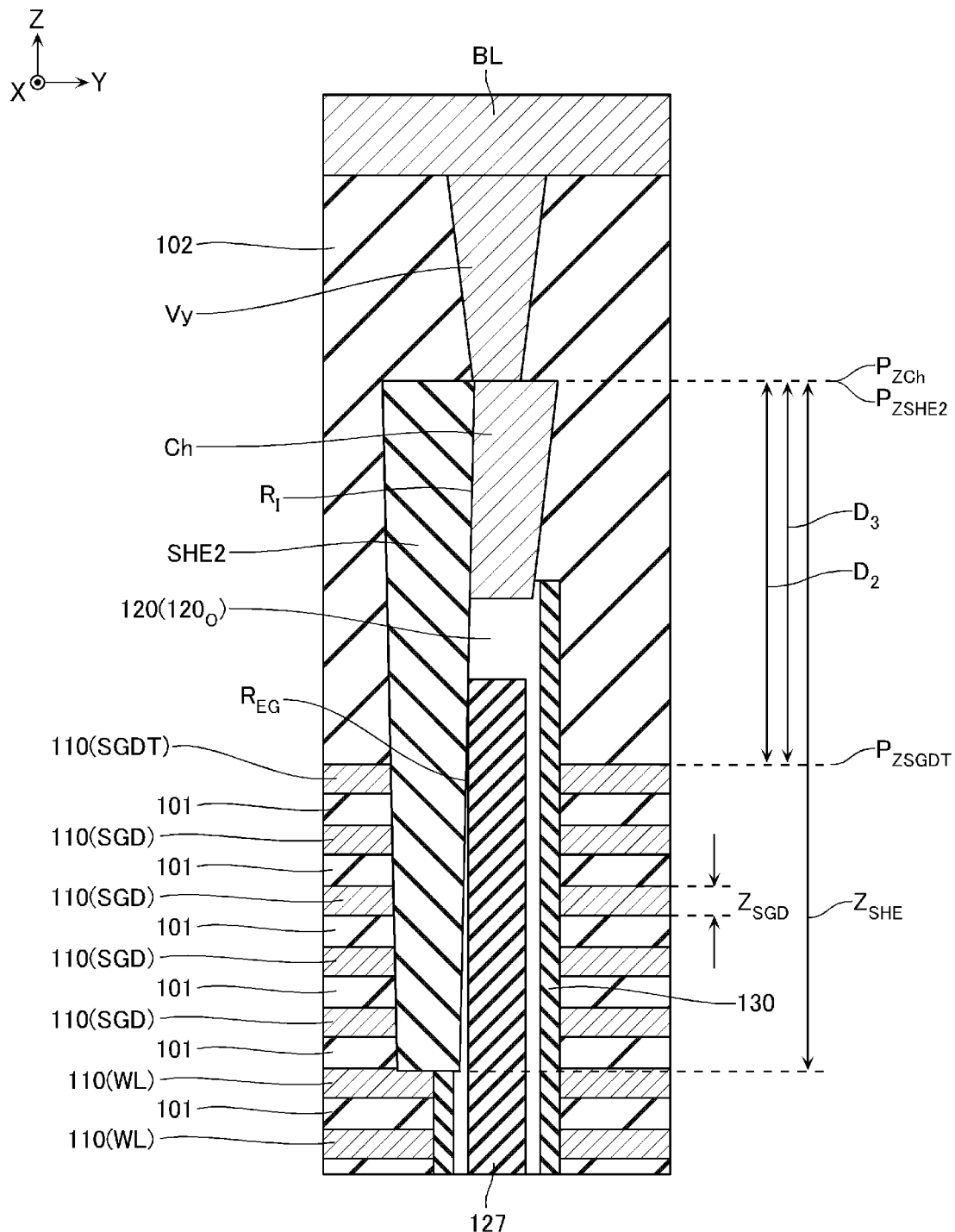
FIG. 27 is a schematic cross-sectional view showing a configuration of a part of a semiconductor memory device according to a second embodiment.

Next, a semiconductor memory device according to a second embodiment will be described with reference to FIG. 27. FIG. 27 is a schematic cross-sectional view showing a configuration of a part of the semiconductor memory device according to the second embodiment.

As described with reference to FIG. 7, the upper end of the inter-string-unit insulating layer SHE is provided above the upper end of the via contact electrode Ch in the semiconductor memory device according to the first embodiment. However, such a configuration is merely an example. Hereinafter, an example will be described in which a position of an upper end of an inter-string-unit insulating layer SHE2 in the Z direction is equal to a position of the upper end of the via contact electrode Ch in the Z direction.

The semiconductor memory device according to the second embodiment is basically configured in the same manner as the semiconductor memory device according to the first embodiment. However, the semiconductor memory device according to the second embodiment includes the inter-string-unit insulating layers SHE2 instead of the inter-string-unit insulating layers SHE.

The inter-string-unit insulating layer SHE2 is basically configured in the same manner as the inter-string-unit insulating layer SHE. However, in the semiconductor memory device according to the second embodiment, the position of the upper end of the inter-string-unit insulating layer SHE2 in the Z direction is equal to the position of the upper end of the via contact electrode Ch in the Z direction. Therefore, when the position of the upper end of the inter-string-unit insulating layer SHE2 in the Z direction is set as $P_{ZSHE2}$, a distance $D_3$ between the position $P_{ZSHE2}$ and the position $P_{ZSGDT}$ is equal to the distance $D_2$ between the position $P_{ZCh}$ and the position $P_{ZSGDT}$.

The semiconductor memory device according to the second embodiment is basically manufactured in the same manner as the semiconductor memory device according to the first embodiment. However, when the semiconductor memory device according to the second embodiment is manufactured, a part of the insulating layer 102 is also removed together with a part of the insulating layer SHEB to expose an upper surface of the via contact electrode Ch in the step described with reference to FIG. 23. In some examples, this step may be performed by a method such as CMP, instead of a method such as RIE.

When the semiconductor memory device according to the second embodiment is manufactured, the inter-string-unit insulating layer SHE2 is also formed after formation of the via contact electrode Ch. Therefore, generation of the leak current as described above can be avoided.

Third Embodiment

Figure 28:
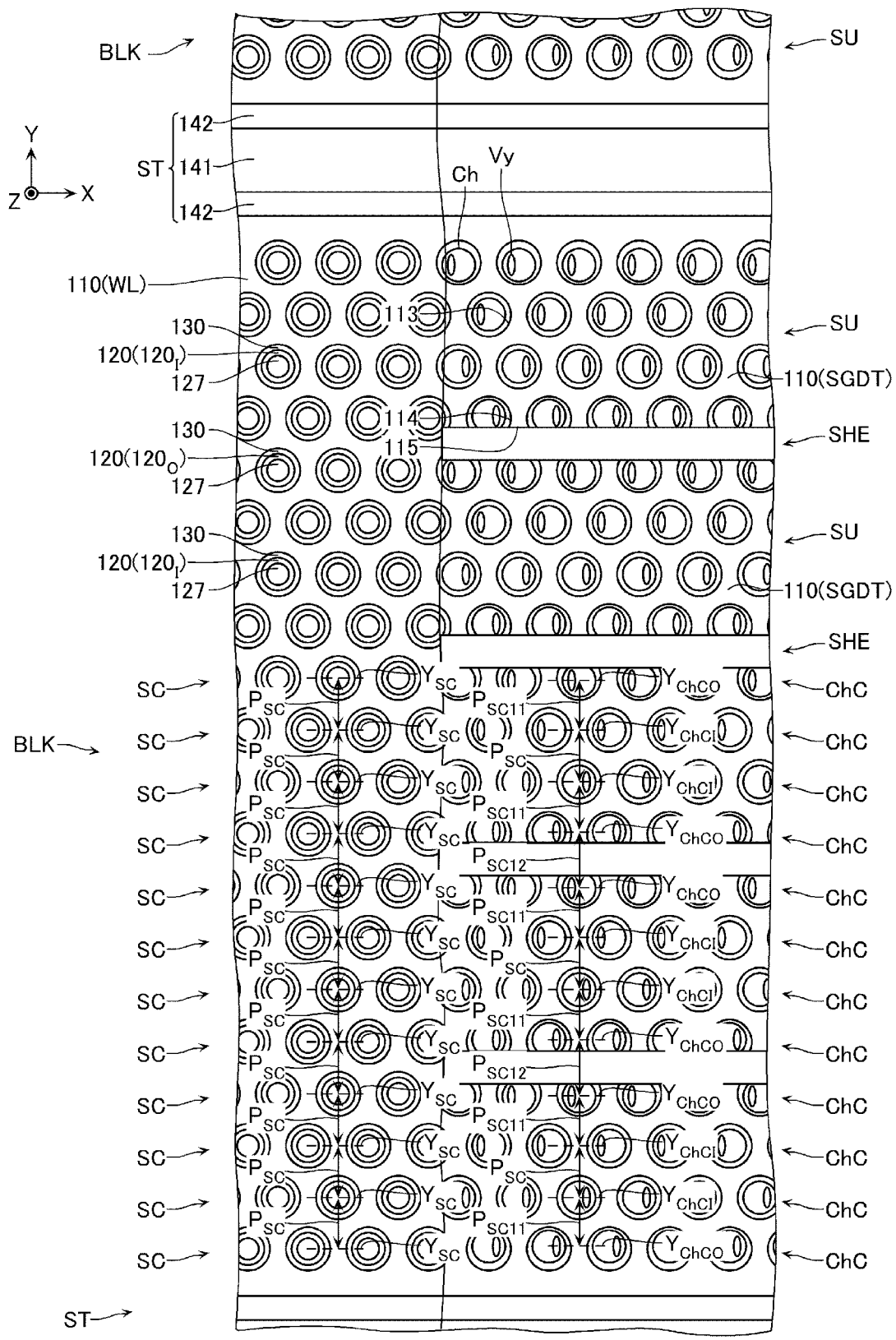
FIG. 28 is a schematic plan view showing a configuration of a part of a semiconductor memory device according to a third embodiment.
Figure 29:
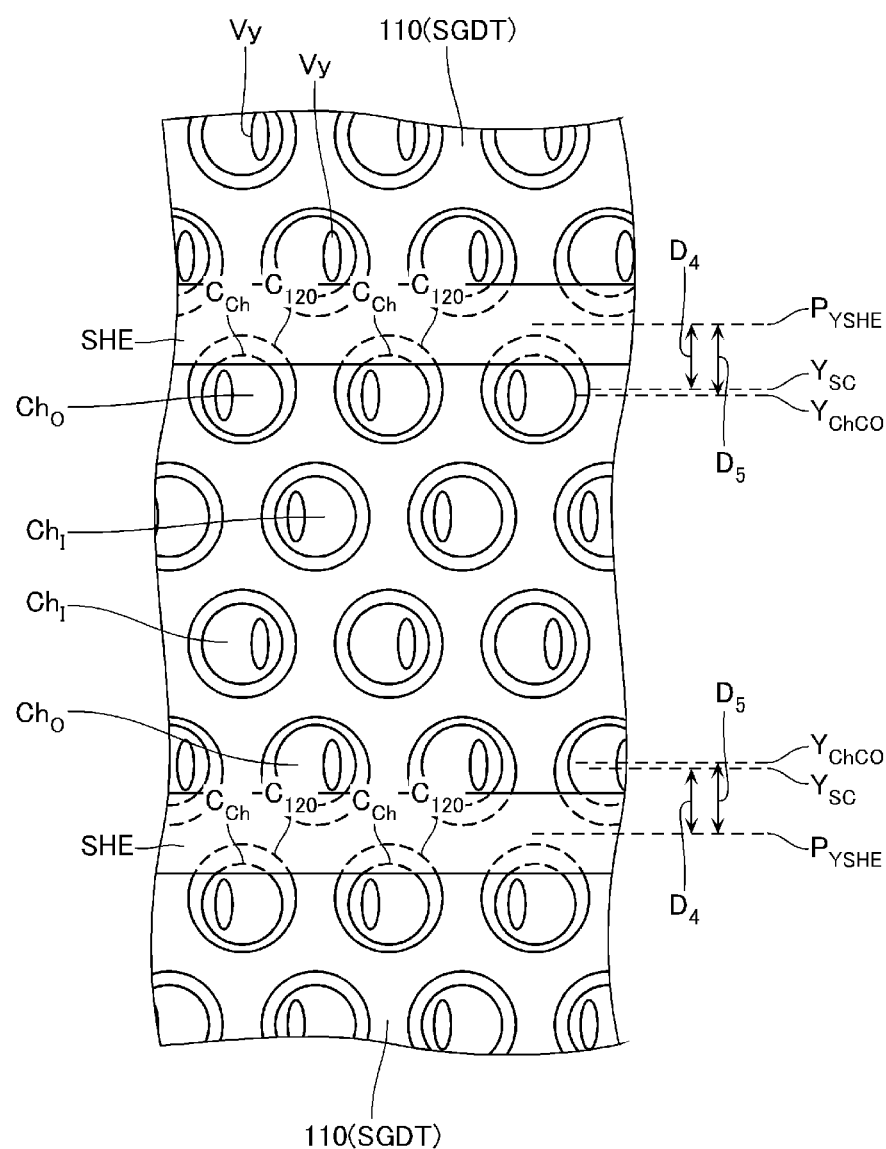
FIG. 29 is a schematic plan view showing a configuration of a part of a semiconductor memory device according to a third embodiment.

Next, a semiconductor memory device according to a third embodiment will be described with reference to FIGS. 28 and 29. Each of FIGS. 28 and 29 is a schematic plan view showing a configuration of a part of the semiconductor memory device according to the third embodiment. A part of FIG. 28 shows an XY cross section at a height position corresponding to the conductive layer 110 (WL). A part of FIG. 28 and FIG. 29 each show a plane with the bit lines BL and the insulating layer 102 omitted from the depiction.

The semiconductor memory device according to the third embodiment is basically configured in the same manner as the semiconductor memory device according to the first embodiment. However, in the semiconductor memory device according to the third embodiment, the via contact electrodes Ch are arranged in a pattern different from that in the first embodiment.

In the example of FIG. 28, a distance in the Y direction between the central position $Y_{ChCI}$ corresponding to the (4n−1)-th (where n is an integer of 1 to 4) via contact electrode row ChC counted from one side in the Y direction and the central position $Y_{ChCO}$ corresponding to the 4n-th via contact electrode row ChC counted from the one side in the Y direction is less than the pitch $P_{SC}$. This distance is referred to as a pitch $P_{SC11}$.

In the example of FIG. 28, a distance in the Y direction between the central position $Y_{ChCO}$ corresponding to the 4n-th via contact electrode row ChC counted from the one side in the Y direction and the central position $Y_{ChCO}$ corresponding to the (4n+1)-th via contact electrode row ChC counted from the one side in the Y direction is larger than the pitch $P_{SC}$. This distance is referred to as a pitch $P_{SC12}$.

In the example of FIG. 28, a distance in the Y direction between the central position $Y_{ChCO}$ corresponding to the (4n+1)-th via contact electrode row ChC counted from the one side in the Y direction and the central position $Y_{ChCI}$ corresponding to the (4n+2)-th via contact electrode row ChC counted from the one side in the Y direction is smaller than the pitch $P_{SC}$. The distance can be equal to the pitch $P_{SC11}$.

FIG. 29 shows the central position $Y_{ChCO}$, in the Y direction, of the circumscribed circle of the via contact electrode $Ch_O$, the central position $Y_{SC}$, in the Y direction, of the circumscribed circle of the semiconductor pillar $120_O$, and a central position $P_{YSHE}$ of the inter-string-unit insulating layer SHE in the Y direction. In the example of FIG. 29, a distance $D_5$ between the central position $Y_{ChCO}$ and the central position $P_{YSHE}$ is greater than a distance $D_4$ between the central position $Y_{SC}$ and the central position $P_{YSHE}$. The distance $D_4$ may be half the pitch $P_{SC}$. The distance $D_4$ can be defined, for example, in an XY cross section including the conductive layer 110 (SGD) or the conductive layer 110 (SGDT). The distance $D_5$ may be half the pitch $P_{SC12}$.

As described with reference to FIG. 3, the plurality of central positions $Y_{ChCI}$ and $Y_{ChCO}$ are arranged adjacently at the pitch $P_{SC}$ in the Y direction for the semiconductor memory device according to the first embodiment. However, with such a configuration, an area of the via contact electrode $Ch_O$ when viewed from the Z direction may be reduced, and a resistance value of the via contact electrode $Ch_O$ may increase. In addition, a positioning margin of the via contact electrode Vy in the Y direction may be reduced.

Therefore, in the semiconductor memory device according to the third embodiment, the central position $Y_{ChCO}$ corresponding to the via contact electrode $Ch_O$ is kept away from the inter-string-unit insulating layer SHE. As a result, an increase in the resistance value of the via contact electrode Ch and a reduction in the positioning margin of the via contact electrode Vy in the Y direction can be avoided.

Fourth Embodiment

Figure 30:
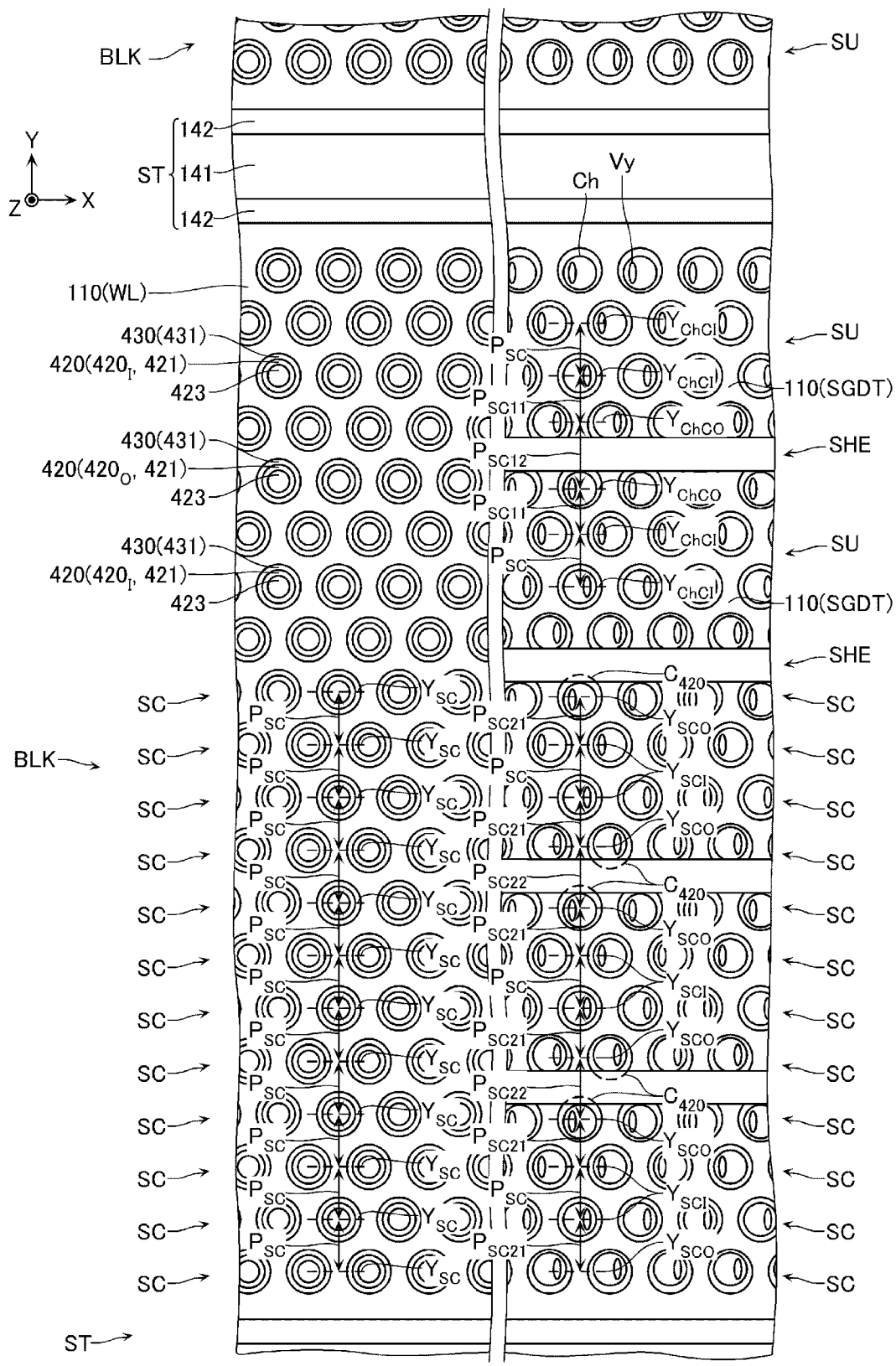
FIG. 30 is a schematic plan view showing a configuration of a part of a semiconductor memory device according to a fourth embodiment.
Figure 31:
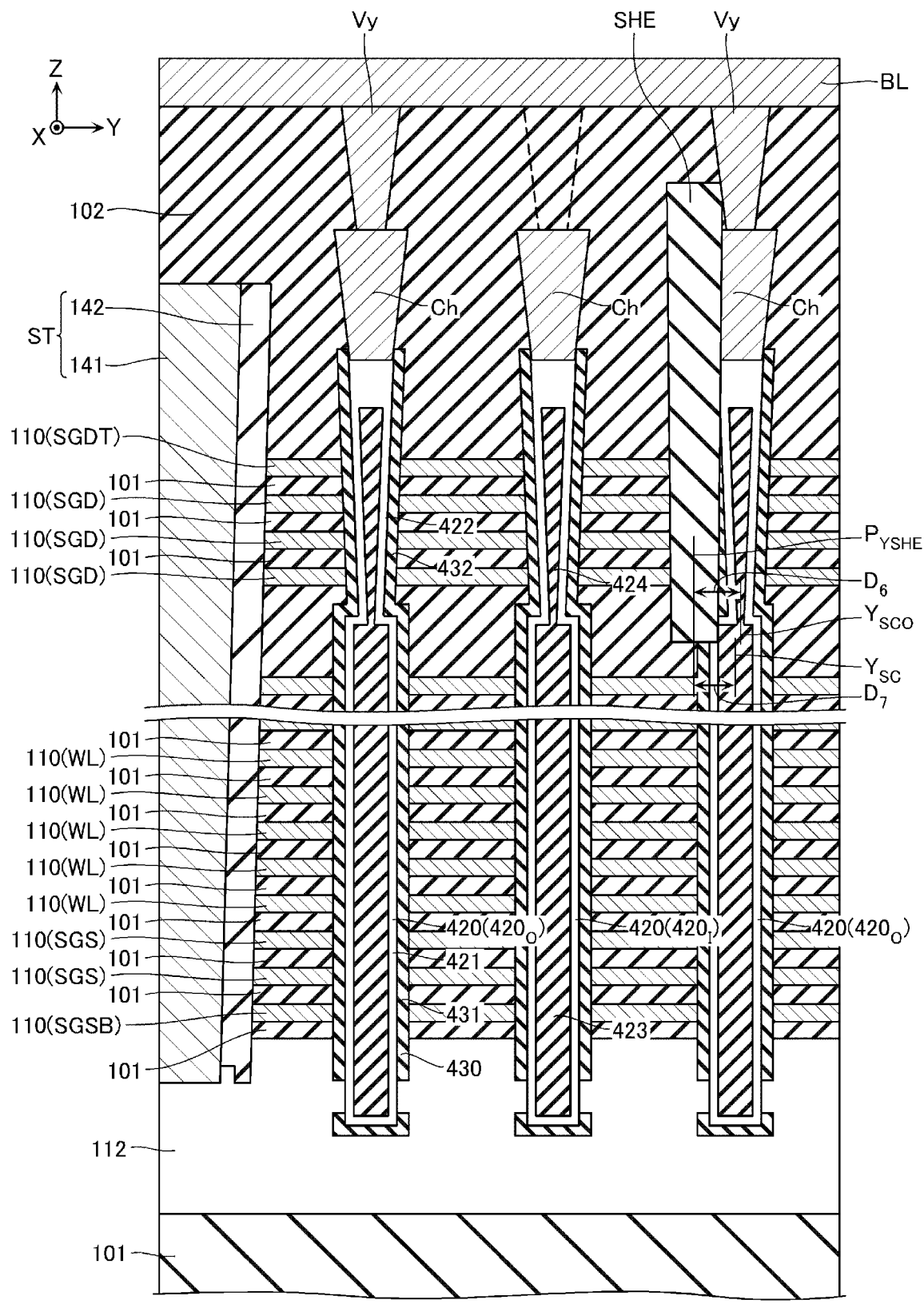
FIG. 31 is a schematic cross-sectional view showing a configuration of a part of a semiconductor memory device according to a fourth embodiment.

Next, a semiconductor memory device according to a fourth embodiment will be described with reference to FIGS. 30 and 31. FIG. 30 is a schematic plan view showing a configuration of a part of the semiconductor memory device according to the fourth embodiment. A part of FIG. 30 shows an XY cross section at a height position corresponding to the conductive layer 110 (WL). Further, a part of FIG. 30 shows a plane with the bit lines BL and the insulating layer 102 omitted. FIG. 31 is a schematic cross-sectional view showing a configuration of a part of the semiconductor memory device.

The semiconductor memory device according to the fourth embodiment is basically configured in the same manner as the semiconductor memory device according to the third embodiment. However, the semiconductor memory device according to the fourth embodiment includes semiconductor pillars 420 and gate insulating films 430 instead of the semiconductor pillars 120 and the gate insulating films 130.

As shown in FIG. 31, each of the semiconductor pillars 420 includes a portion 421 and a portion 422. The portions 421 and 422 each comprise, for example, polycrystalline silicon (Si). The portion 421 includes regions corresponding to the regions 121 to 123 of the semiconductor pillar 120 described with reference to FIG. 4. The portion 422 includes regions corresponding to the regions 124 to 126 of the semiconductor pillar 120 described with reference to FIG. 4. The portions 421 and 422 each have a substantially cylindrical shape, and are respectively provided, in central portions thereof, with insulating layers 423 and 424 each made of silicon oxide ($SiO_2$) or the like. A partial region of the portion 422 of a semiconductor pillar $420_O$ may have an arc shape when viewed from the Z direction.

As shown in FIG. 30, in the fourth embodiment, the central positions $Y_{SC}$ of the 20 semiconductor pillar rows SC in the Y direction are evenly arranged adjacently at the pitch $P_{SC}$ in the Y direction in the XY cross section corresponding to the conductive layer 110 (WL). On the other hand, in an XY cross section corresponding to the conductive layer 110 (SGDT), the 20 semiconductor pillar rows SC are not evenly arranged adjacently in the Y direction.

In the XY cross section corresponding to the conductive layer 110 (SGDT), a central position, in the Y direction, of the semiconductor pillar row SC including semiconductor pillars $420_I$ can be set as a central position $Y_{SCI}$. In the XY cross section corresponding to the conductive layer 110 (SGDT), for semiconductor pillars $420_O$ arranged adjacently in the X direction, a central position, in the Y direction, of a plurality of circumscribed circles $C_{420}$ corresponding to the plurality of semiconductor pillars $420_O$ is taken as a central position $Y_{SCO}$.

In the example of FIG. 30, a distance in the Y direction between the central position $Y_{SCI}$ corresponding to the (4n−1)-th (where n is an integer of 1 to 4) semiconductor pillar row SC counted from one side in the Y direction and the central position $Y_{SCO}$ corresponding to the 4n-th semiconductor pillar row SC counted from the one side in the Y direction is smaller than the pitch $P_{SC}$. Hereinafter, the distance is referred to as a pitch $P_{SC21}$.

In the example of FIG. 30, a distance in the Y direction between the central position $Y_{SCO}$ corresponding to the 4n-th semiconductor pillar row SC counted from the one side in the Y direction and the central position $Y_{SCO}$ corresponding to the (4n+1)-th semiconductor pillar row SC counted from the one side in the Y direction is larger than the pitch $P_{SC}$. Hereinafter, the distance is referred to as a pitch $P_{SC22}$.

In the example of FIG. 30, a distance in the Y direction between the central position $Y_{SCO}$ corresponding to the (4n+1)-th semiconductor pillar row SC counted from the one side in the Y direction and the central position $Y_{SCI}$ corresponding to the (4n+2)-th semiconductor pillar row SC counted from the one side in the Y direction is smaller than the pitch $P_{SC}$. The distance is equal to the pitch $P_{SC21}$.

In the example of FIG. 30, the pitch $P_{SC11}$ is smaller than the pitch $P_{SC21}$. The pitch $P_{SC12}$ is larger than the pitch $P_{SC22}$.

FIG. 31 shows the central position $Y_{SC}$ corresponding to the portion 421 of the semiconductor pillar 420, the central position $Y_{SCO}$ corresponding to the portion 422 of the semiconductor pillar 420, and the central position $P_{YSHE}$ of the inter-string-unit insulating layer SHE in the Y direction. In an example of FIG. 31, a distance $D_6$ between the central position $Y_{SCO}$ and the central position $P_{YSHE}$ is larger than a distance $D_7$ between the central position $Y_{SC}$ and the central position $P_{YSHE}$.

As shown in FIG. 31, each of the gate insulating films 430 includes a portion 431 and a portion 432.

The portion 431 is basically configured in the same manner as the gate insulating film 130 described with reference to FIGS. 4 and 5. However, the portion 431 extends in the Z direction along an outer peripheral surface of the portion 421 of the semiconductor pillar 420 excluding a partial region. For example, as shown in FIG. 31, the portion 431 is not provided at a contact portion between the portion 421 and the conductive layer 112.

The portion 432 is basically configured in the same manner as the gate insulating film 130 described with reference to FIGS. 4 and 5. The portion 432 also extends in the Z direction along an outer peripheral surface of the portion 422 of the semiconductor pillar 420 excluding a partial region. As shown in FIG. 31, the portion 432 need not be provided at a contact portion between the portion 422 and the inter-string-unit insulating layer SHE.

In the semiconductor memory device according to the fourth embodiment, the central position $Y_{SCO}$ corresponding to the 4n-th semiconductor pillar row SC counted from the one side in the Y direction and the central position $Y_{SCO}$ corresponding to the (4n+1)-th semiconductor pillar row SC counted from the one side in the Y direction are kept away from the inter-string-unit insulating layer SHE as shown in FIG. 30. As a result, as compared with the semiconductor memory device according to the third embodiment, the central position $Y_{ChCO}$ corresponding to the via contact electrode $Ch_O$ can be kept farther away from the inter-string-unit insulating layer SHE.

Another Embodiment

Figure 32:
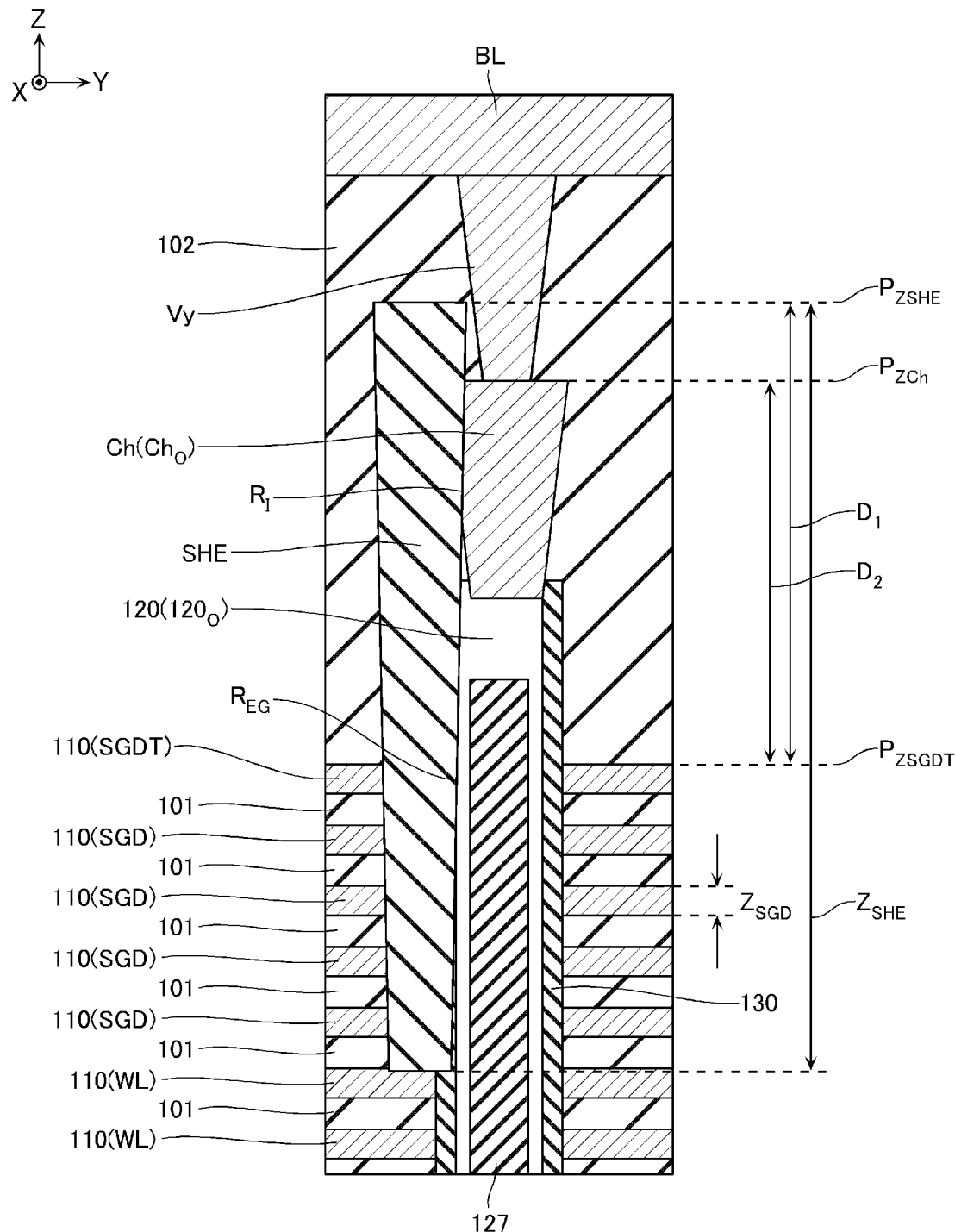
FIG. 32 is a schematic cross-sectional view showing a configuration of a part of a semiconductor memory device according to still another embodiment.

A semiconductor memory device according to another embodiment will be described with reference to FIG. 32. FIG. 32 is a schematic cross-sectional view showing a configuration of a part of the semiconductor memory device according to this other embodiment.

In the example of FIG. 7, the region $R_{EG}$ of the outer peripheral surface of the semiconductor pillar $120_O$ is continuous with the region $R_I$ of the outer peripheral surface of the via contact electrode $Ch_O$. However, in another example, the contact surface between the via contact electrode $Ch_O$ and the semiconductor pillar $120_O$ may be spaced from the groove SHEA during the step described with reference to FIG. 21. In such a case, as shown in FIG. 32, the region $R_{EG}$ of the outer peripheral surface of the semiconductor pillar $120_O$ is not continuous with the region $R_I$ of the outer peripheral surface of the via contact electrode $Ch_O$.

Further, for example, the semiconductor memory devices according to the third embodiment and the fourth embodiment may include the inter-string-unit insulating layers SHE2 (FIG. 27) instead of the inter-string-unit insulating layers SHE.

As described with reference to FIGS. 3, 28, and 30, in the first embodiment to the fourth embodiment, the plurality of semiconductor pillar rows SC are arranged adjacently at the constant pitch $P_{SC}$ in the Y direction in the XY cross section corresponding to the conductive layer 110 (WL). However, in the XY cross section corresponding to the conductive layer 110 (WL), pitches of the semiconductor pillar rows SC in the Y direction need not necessarily be constant. For example, a distance between the central positions $Y_{SC}$, which respectively correspond to the first semiconductor pillar row SC and the second semiconductor pillar row SC counted from one side in the Y direction among the 20 semiconductor pillar rows SC corresponding to the memory block BLK, may be larger than the pitch $P_{SC}$. For example, a distance between the central positions $Y_{SC}$, which respectively correspond to the 19-th semiconductor pillar row SC and the 20-th semiconductor pillar row SC counted from the one side in the Y direction among the 20 semiconductor pillar rows SC corresponding to the memory block BLK, may be larger than the pitch $P_{SC}$.

In addition, the configurations described above may be formed upside down. In some examples, the memory cell array MCA and the peripheral circuit PC described with reference to FIG. 1 may be formed on different wafers. In such a case, the wafer on which the memory cell array MCA is formed and the wafer on which the peripheral circuit PC is formed may be bonded to each other to form the semiconductor memory device. In such a case, a configuration provided in the memory cell array MCA may be upside down with respect to the configurations described above.

Others

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a plurality of first conductive layers adjacent in a first direction;
   a bit line on one side of the plurality of first conductive layers and extending in a second direction that intersects the first direction;
   a second conductive layer between the bit line and the plurality of first conductive layers;
   a first insulating layer between the bit line and the plurality of first conductive layers, the first insulating layer adjacent to the second conductive layer in the second direction;
   a first semiconductor pillar and a second semiconductor pillar that each extend in the first direction through the second conductive layer and plurality of first conductive layers;
   a first charge storage film between the first semiconductor pillar and the plurality of first conductive layers;
   a second charge storage film between the second semiconductor pillar and the plurality of first conductive layers;
   a first via contact electrode connected to an end portion of the first semiconductor pillar on a bit line side of the first semiconductor pillar; and
   a second via contact electrode connected to an end portion of the second semiconductor pillar on a bit line side of the second semiconductor pillar;
   a third semiconductor pillar that extends in the first direction through the second conductive layer and the plurality of first conductive layers and is adjacent to the first semiconductor pillar in a third direction intersecting the first direction and the second direction;
   a third charge storage film between the third semiconductor pillar and the plurality of first conductive layers; and
   a third via contact electrode connected to an end portion of the third semiconductor pillar on a bit line side of the third semiconductor pillar, wherein
   a first part of the first insulating layer overlaps with the first semiconductor pillar when viewed from the first direction,
   the first insulating layer does not overlap with the second semiconductor pillar when viewed from the first direction,
   a length of the first via contact electrode in the second direction is less than a length of the second via contact electrode in the second direction,
   the first insulating layer is in contact with the first semiconductor pillar, the first via contact electrode, the third semiconductor pillar, and the third via contact electrode,
   a first outer peripheral surface portion of the first via contact electrode that is in contact with the first insulating layer extends in the third direction, and
   a second outer peripheral surface portion of the third via contact electrode that is in contact with the first insulating layer extends in the third direction.

2. The semiconductor memory device according to claim 1, wherein, in a cross section including the second conductive layer and extending in the second direction and the third direction, a length of the first semiconductor pillar in the second direction is less than a length of the second semiconductor pillar in the second direction.

3. The semiconductor memory device according to claim 1, further comprising:
   a third conductive layer between the bit line and the plurality of first conductive layers, the third conductive layer adjacent to the second conductive layer in the second direction with the first insulating layer interposed therebetween;
   a fourth semiconductor pillar extending in the first direction through the third conductive layer and the plurality of first conductive layers;
   a fourth charge storage film between the fourth semiconductor pillar and the plurality of first conductive layers; and
   a fourth via contact electrode connected to an end portion of the fourth semiconductor pillar on a bit line side of the fourth semiconductor pillar, wherein
   a second part of the first insulating layer overlaps with the fourth semiconductor pillar when viewed from the first direction.

4. The semiconductor memory device according to claim 1, wherein the first outer peripheral surface portion and the second outer peripheral surface portion are aligned in the third direction.

5. The semiconductor memory device according to claim 1, wherein a curvature of the first outer peripheral surface portion is different from a curvature of an outer peripheral surface portion of the first via contact electrode separated from the first insulating layer.

6. The semiconductor memory device according to claim 1, wherein
   when a position, along the first direction, of an end portion of the first insulating layer on the bit line side is a first position,
   a position, along the first direction, of an end portion of the first via contact electrode on the bit line side is a second position, and
   a position, along the first direction, of a surface of the second conductive layer on the bit line side is a third position,
   a distance between the first position and the third position is greater than or equal to a distance between the second position and the third position.

7. The semiconductor memory device according to claim 6, wherein a contact surface between the first insulating layer and the first semiconductor pillar is continuous with a contact surface between the first insulating layer and the first via contact electrode.

8. The semiconductor memory device according to claim 1, wherein a contact surface between the first insulating layer and the first semiconductor pillar is not continuous with a contact surface between the first insulating layer and the first via contact electrode.

9. The semiconductor memory device according to claim 1, wherein
when a cross section, which extends in the second direction and the third direction and includes the first via contact electrode, is a first cross section,
when a central position, along the second direction, of a circumscribed circle of the first via contact electrode in the first cross section is a fourth position,
when a central position, along the second direction, of the first insulating layer in the first cross section is a fifth position,
when a cross section extending in the second direction and the third direction and including the second conductive layer is a second cross section,
when a central position, along the second direction, of a circumscribed circle of the first semiconductor pillar in the second cross section is a sixth position, and
when a central position, along the second direction, of the first insulating layer in the second cross section is a seventh position,
a distance between the fourth position and the fifth position is greater than a distance between the sixth position and the seventh position.

10. The semiconductor memory device according to claim 9, wherein
the first semiconductor pillar includes:
a first portion extending in the first direction and facing the plurality of first conductive layers; and
a second portion extending in the first direction and facing the second conductive layer, and
when a central position of the first portion along the second direction is an eighth position, the eighth position is between the fifth position and the sixth position in the second direction or between the seventh position and the sixth position in the second direction.

11. A semiconductor memory device comprising:
a plurality of first conductive layers adjacent in a first direction;
a bit line on one side of the plurality of first conductive layers and extending in a second direction that intersects the first direction;
a second conductive layer between the bit line and the plurality of first conductive layers;
a first insulating layer between the bit line and the plurality of first conductive layers, the first insulating layer adjacent to the second conductive layer in the second direction;
a first semiconductor pillar and a second semiconductor pillar that each extend in the first direction through the second conductive layer and the plurality of first conductive layers;
a first charge storage film between the first semiconductor pillar and the plurality of first conductive layers;
a second charge storage film between the second semiconductor pillar and the plurality of first conductive layers;
a first via contact electrode connected to an end portion of the first semiconductor pillar on a bit line side of the first semiconductor pillar; and a second via contact electrode connected to an end portion of the second semiconductor pillar on a bit line side of the second semiconductor pillar, wherein
a first part of the first insulating layer overlaps with the first semiconductor pillar when viewed from the first direction,
the first insulating layer does not overlap with the second semiconductor pillar when viewed from the first direction,
the first insulating layer is in contact with the first via contact electrode,
when a cross section, which extends in the second direction and a third direction intersecting the first direction and the second direction and which includes the first via contact electrode and the second via contact electrode, is a first cross section, an area of the first via contact electrode in the first cross section is less than an area of the second via contact electrode in the first cross section, and
a curvature of an outer peripheral surface portion of the first via contact electrode that is in contact with the first insulating layer is different from a curvature of an outer peripheral surface portion of the first via contact electrode separated from the first insulating layer.

12. The semiconductor memory device according to claim 11, wherein, when a cross section extending in the second direction and the third direction and including the second conductive layer is a second cross section, an area of the first semiconductor pillar in the second cross section is less than an area of the second semiconductor pillar in the second cross section.

13. The semiconductor memory device according to claim 11, further comprising:
a third conductive layer between the bit line and the plurality of first conductive layers, the third conductive layer adjacent to the second conductive layer in the second direction with the first insulating layer interposed therebetween;
a third semiconductor pillar extending in the first direction through the third conductive layer and the plurality of first conductive layers; and
a third charge storage film between the third semiconductor pillar and the plurality of first conductive layers, wherein
a second part of the first insulating layer overlaps with the third semiconductor pillar when viewed from the first direction.

14. The semiconductor memory device according to claim 11, wherein
when a position, along the first direction, of an end portion of the first insulating layer on the bit line side is a first position,
a position, along the first direction, of an end portion of the first via contact electrode on the bit line side is a second position, and
a position, along the first direction, of a surface of the second conductive layer on the bit line side is a third position,
a distance between the first position and the third position is greater than or equal to a distance between the second position and the third position.

15. The semiconductor memory device according to claim 11, wherein
the first insulating layer is in contact with the first semiconductor pillar, and a contact surface between the first insulating layer and the first semiconductor layer is continuous with a contact surface between the first insulating layer and the first via contact electrode.

16. The semiconductor memory device according to claim 11, wherein
the first insulating layer is in contact with the first semiconductor pillar, and
a contact surface between the first insulating layer and the first semiconductor pillar is not continuous with a contact surface between the first insulating layer and the first via contact electrode.

17. The semiconductor memory device according to claim 11, wherein
when a central position, along the second direction, of a circumscribed circle of the first via contact electrode in the first cross section is a fourth position,
when a central position, along the second direction, of the first insulating layer in the first cross section is a fifth position,
when a cross section extending in the second direction and the third direction and including the second conductive layer is a second cross section,
when a central position, along the second direction, of a circumscribed circle of the first semiconductor pillar in the second cross section is a sixth position, and
when a central position, along the second direction, of the first insulating layer in the second cross section is a seventh position,
a distance between the fourth position and the fifth position is greater than a distance between the sixth position and the seventh position.

18. The semiconductor memory device according to claim 17, wherein
the first semiconductor pillar includes:
a first portion extending in the first direction and facing the plurality of first conductive layers; and
a second portion extending in the first direction and facing the second conductive layer, and
when a central position of the first portion along the second direction is an eighth position, the eighth position is between the fifth position and the sixth position in the second direction or between the seventh position and the sixth position in the second direction.

* * * * *